US011501921B2

(12) United States Patent
Kageyama

(10) Patent No.: US 11,501,921 B2
(45) Date of Patent: Nov. 15, 2022

(54) MULTILAYER CERAMIC ELECTRONIC COMPONENT

(71) Applicant: Murata Manufacturing Co., Ltd., Nagaokakyo (JP)

(72) Inventor: Tomohiro Kageyama, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 301 days.

(21) Appl. No.: 16/599,268

(22) Filed: Oct. 11, 2019

(65) Prior Publication Data

US 2020/0118757 A1    Apr. 16, 2020

(30) Foreign Application Priority Data

Oct. 16, 2018    (JP) .............................. JP2018-195314

(51) Int. Cl.
    *H01G 2/06*    (2006.01)
    *H01G 4/005*    (2006.01)
    (Continued)

(52) U.S. Cl.
    CPC ........... *H01G 4/2325* (2013.01); *H01G 2/065* (2013.01); *H01G 4/005* (2013.01); *H01G 4/1209* (2013.01); *H01G 4/30* (2013.01); *H05K 3/341* (2013.01)

(58) Field of Classification Search
    CPC ...... H01G 2/065; H01G 4/005; H01G 4/1209; H01G 4/228; H01G 4/2325; H01G 4/30; H01G 4/38; H05K 3/341
    See application file for complete search history.

(56) References Cited

U.S. PATENT DOCUMENTS 6,288,887 B1    9/2001  Yoshida et al.
2012/0320536 A1*  12/2012  Yamamoto ............ H01L 21/561
                                                          361/728
(Continued)

FOREIGN PATENT DOCUMENTS

CN    107278322 A    10/2017
JP    07-249541 A    9/1995
(Continued)

OTHER PUBLICATIONS

Official Communication issued in corresponding Korean Patent Application No. 10-2019-0126811, dated Jan. 11, 2021.
(Continued)

*Primary Examiner* — Nathan Milakovich
(74) *Attorney, Agent, or Firm* — Keating & Bennett, LLP

(57) ABSTRACT

A multilayer ceramic electronic component includes multilayer ceramic electronic component bodies each including a laminate and first and second outer electrodes respectively disposed on two end surfaces of the laminate, first and second metal terminals respectively connected to the first and second outer electrodes, and first and second terminal blocks respectively connected to the first and second metal terminals. A thickness dimension of each multilayer ceramic electronic component body in a height direction is less than a width dimension of the multilayer ceramic electronic component body in a width direction. Each multilayer ceramic electronic component body is disposed such that a first or second side surface faces a mounting surface. The first and second metal terminals are respectively disposed astride the first and second outer electrodes of the multilayer ceramic electronic component bodies.

16 Claims, 20 Drawing Sheets

(51) Int. Cl.
*H01G 4/30* (2006.01)
*H05K 3/34* (2006.01)
*H01G 4/232* (2006.01)
*H01G 4/12* (2006.01)

(56) References Cited

U.S. PATENT DOCUMENTS

| | | |
|---|---|---|
| 2016/0217926 A1 | 7/2016 | Jun et al. |
| 2017/0280564 A1 | 9/2017 | Nishimura |
| 2018/0047507 A1 | 2/2018 | Koini et al. |
| 2019/0115156 A1* | 4/2019 | Konrad ............... H01G 2/065 |
| 2020/0006002 A1* | 1/2020 | Itamochi ............. H01G 4/1227 |
| 2020/0006006 A1* | 1/2020 | Tahara ................ H01G 4/232 |
| 2021/0202175 A1* | 7/2021 | Park .................... H01G 4/232 |

FOREIGN PATENT DOCUMENTS

| | | | |
|---|---|---|---|
| JP | H07249541 A | * | 9/1995 |
| JP | 09-266125 A | | 10/1997 |
| JP | 09-283363 A | | 10/1997 |
| JP | 2000-235932 A | | 8/2000 |
| JP | 2000-323353 A | | 11/2000 |
| JP | 2008-172050 A | | 7/2008 |
| JP | 2008-277505 A | | 11/2008 |
| JP | 2017-175000 A | | 9/2017 |
| JP | 2018-511937 A | | 4/2018 |
| JP | 2018-133518 A | | 8/2018 |
| KR | 10-2016-0090589 A | | 8/2016 |

OTHER PUBLICATIONS

Official Communication issued in corresponding Chinese Patent Application No. 201910986994.1, dated Mar. 11, 2021.
Official Communication issued in corresponding Chinese Patent Application No. 201910986994.1, dated Aug. 12, 2021.

* cited by examiner

CROSS-SECTIONAL VIEW TAKEN ALONG LINE III-III

CROSS-SECTIONAL VIEW TAKEN ALONG LINE IV-IV

CROSS-SECTIONAL VIEW TAKEN ALONG LINE IX-IX

CROSS-SECTIONAL VIEW TAKEN ALONG LINE X-X

CROSS-SECTIONAL VIEW TAKEN ALONG LINE XXI-XXI

CROSS-SECTIONAL VIEW TAKEN ALONG LINE XXII-XXII

FIG. 24A  Comparative Example
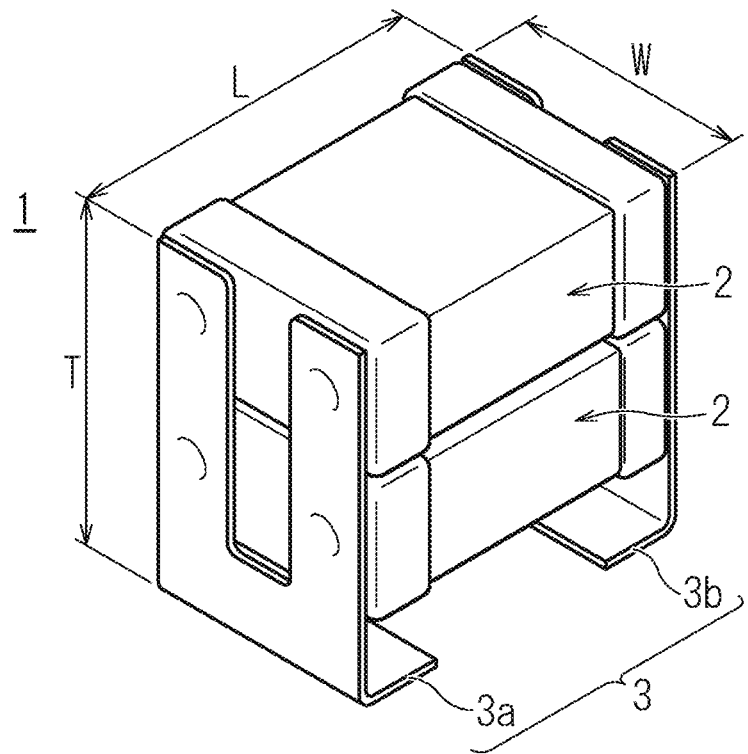
FIG. 24B  Comparative Example
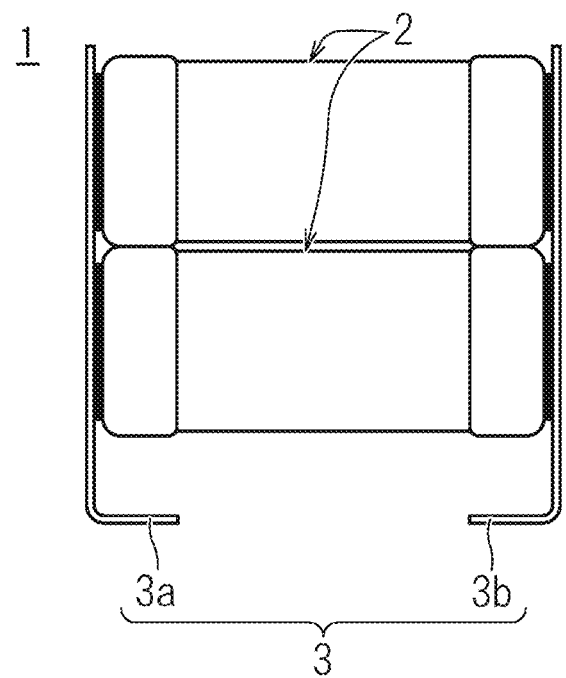

FIG. 25A Comparative Example
FIG. 25B Comparative Example
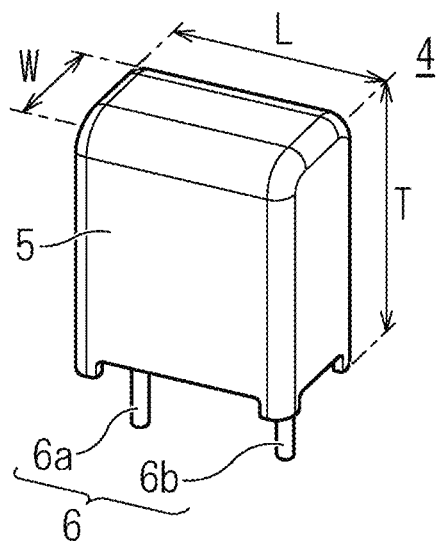
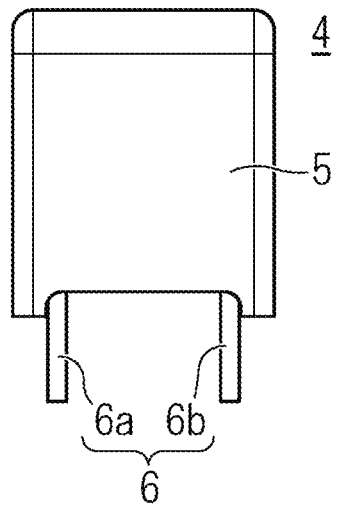

MULTILAYER CERAMIC ELECTRONIC COMPONENT

CROSS REFERENCE TO RELATED APPLICATIONS

This application claims the benefit of priority to Japanese Patent Application No. 2018-195314 filed on Oct. 16, 2018. The entire contents of this application are hereby incorporated herein by reference.

BACKGROUND OF THE INVENTION

1. Field of the Invention

The present invention relates to a multilayer ceramic electronic component including metal terminals and, more specifically, to, for example, a multilayer ceramic electronic component including two metal terminals disposed along a plurality of side-by-side disposed multilayer ceramic electronic component bodies and connected to outer electrodes of the multilayer ceramic electronic component bodies.

2. Description of the Related Art

In recent years, with consideration for the environment, inverter circuits suitable for energy saving and high efficiency have been employed. However, there is a trend that working voltage increases, so electronic components that support high voltage and large current tend to be needed.

When used at a high-voltage, a creeping discharge, that is, a discharge that occurs between outer electrodes, more easily occurs in electronic components like multilayer ceramic capacitors. Therefore, for high-voltage inverter circuits, creepage distances are regulated by public standards.

In multilayer ceramic capacitors that are used in high-voltage inverter circuits or other high-voltage circuits, a service temperature range tends to be wide. Therefore, thermal shrinkage and thermal expansion of circuit boards more easily occur as a result of temperature cycles, so there are concerns that deflection stress that is generated as a result of thermal shrinkage and thermal expansion of the circuit boards causes cracks to develop in the multilayer ceramic capacitors.

To meet such requests, in high-voltage inverter circuits, among capacitors, film capacitors as described in, for example, Japanese Unexamined Patent Application Publication No. 2008-172050 and Japanese Unexamined Patent Application Publication No. 2008-277505 and capacitors with metal terminals as described in, for example, Japanese Unexamined Patent Application Publication No. 2000-235932 have been increasingly employed.

With the film capacitors described in Japanese Unexamined Patent Application Publication No. 2008-172050 and Japanese Unexamined Patent Application Publication No. 2008-277505, a creepage distance is ensured; however, a heat-resistant temperature is low, so, when an operating temperature is high, there is a possibility that the film capacitors exhibit thermal runaway due to self-heating caused by current and then fail. Therefore, there is inconvenience that film capacitors having a larger volume more than necessary need to be used.

With capacitor with metal terminals as described in Japanese Unexamined Patent Application Publication No. 2000-235932, since a certain creepage distance is ensured and deflection stress that is generated as a result of thermal shrinkage and thermal expansion of circuit boards is absorbed by the metal terminals, fracture of the capacitor is reduced. On the other hand, to ease stress that occurs based on the difference in coefficient of linear expansion between each metal terminal and the capacitor, an alloy having a high resistivity needs to be used for the metal terminals that serve as current paths. Therefore, there is inconvenience that the metal terminals easily generate heat because of current.

SUMMARY OF THE INVENTION

Preferred embodiments of the present invention provide multilayer ceramic electronic components that can be miniaturized and that can reduce the inconvenience of cracks that are caused by deflection stress of a circuit board and the inconvenience of heat generation of a multilayer ceramic capacitor while reducing a creeping discharge.

According to a preferred embodiment of the present invention, a multilayer ceramic electronic component includes a plurality of multilayer ceramic electronic component bodies, a first metal terminal, a second metal terminal, a first terminal block, and a second terminal block. Each of the plurality of multilayer ceramic electronic component bodies includes a laminate, a first outer electrode, and a second outer electrode. The laminate includes laminated ceramic layers. The laminate includes a first main surface and a second main surface on opposite sides in a height direction, a first side surface and a second side surface on opposite sides in a width direction perpendicular or substantially perpendicular to the height direction, and a first end surface and a second end surface on opposite sides in a longitudinal direction perpendicular or substantially perpendicular to the height direction and the width direction. The first outer electrode is disposed on the laminate to lie on the first end surface and reach at least a portion of the first side surface and at least a portion of the second side surface. The second outer electrode is disposed on the laminate to lie on the second end surface and reach at least a portion of the first side surface and at least a portion of the second side surface. The first metal terminal is connected to each first outer electrode. The second metal terminal is connected to each second outer electrode. The first terminal block is connected to the first metal terminal. The second terminal block is connected to the second metal terminal. A thickness dimension of each of the plurality of multilayer ceramic electronic component bodies in the height direction connecting the first main surface and the second main surface is less than a width dimension of each of the plurality of multilayer ceramic electronic component bodies in the width direction connecting the first side surface and the second side surface. Each of the plurality of multilayer ceramic electronic component bodies is disposed such that the first side surface or the second side surface faces a mounting surface. The first metal terminal is disposed astride the first outer electrodes of the plurality of multilayer ceramic electronic component bodies. The second metal terminal is disposed astride the second outer electrodes of the plurality of multilayer ceramic electronic component bodies. One or a plurality of the first terminal blocks are provided. One or a plurality of the second terminal blocks are provided.

According to the preferred embodiments of the present invention, multilayer ceramic electronic components that can be miniaturized and that can reduce the inconvenience of cracks that are caused by deflection stress of a circuit board and the inconvenience of heat generation of a multilayer ceramic capacitor while reducing a creeping discharge are provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 24A is an external perspective view showing one example of a multilayer ceramic electronic component with metal terminals according to a first comparative embodiment.

FIG. 24B is a front view showing one example of the multilayer ceramic electronic component with metal terminals according to the first comparative embodiment.

FIG. 25A is an external perspective view showing one example of a film capacitor according to a second comparative embodiment.

FIG. 25B is a front view showing one example of the film capacitor according to the second comparative embodiment.

DETAILED DESCRIPTION OF THE PREFERRED EMBODIMENTS

Preferred embodiments of the present invention will be described in detail below with reference to the drawings.

1. Multilayer Ceramic Electronic Component

First Preferred Embodiment

Figure 1:
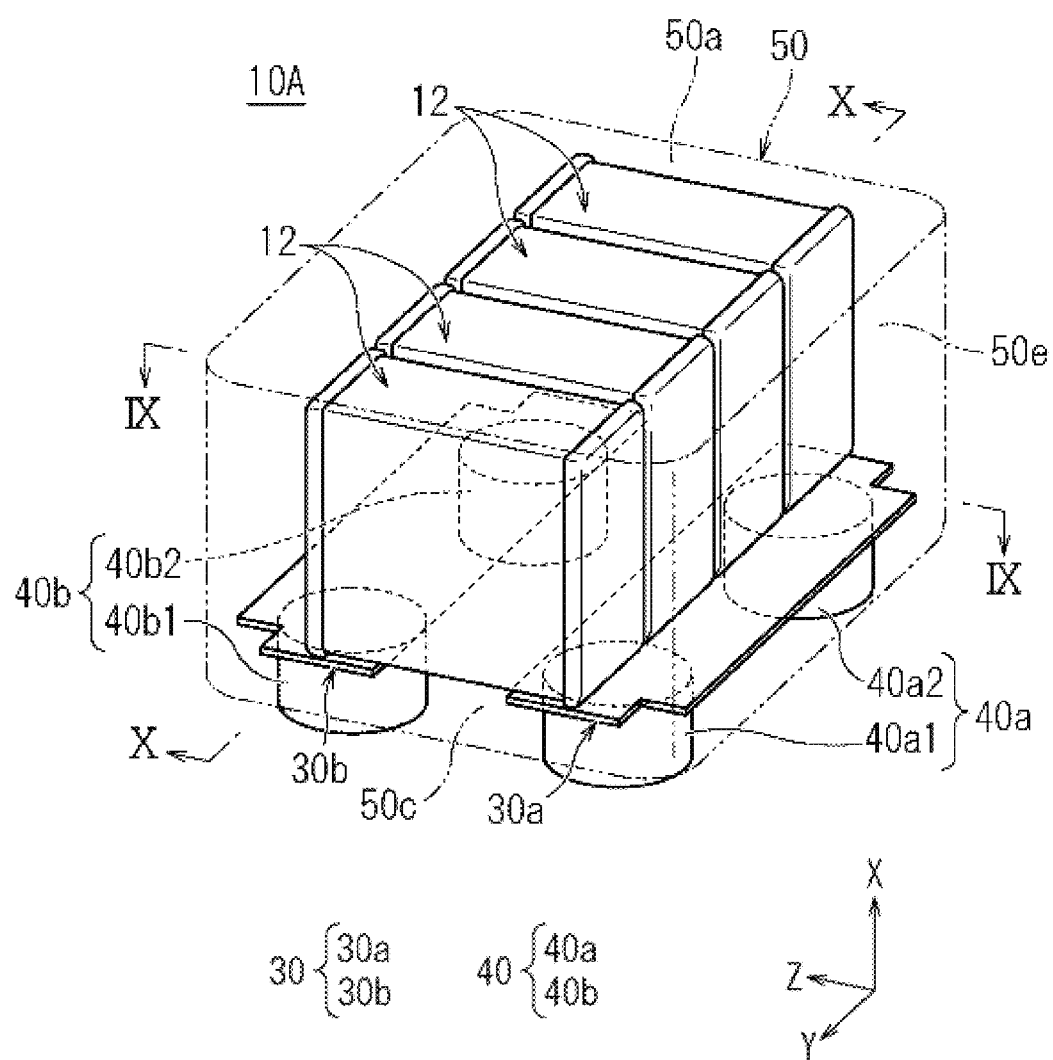
FIG. 1 is an external perspective view showing one example of a multilayer ceramic electronic component according to a first preferred embodiment of the present invention.
Figure 2:
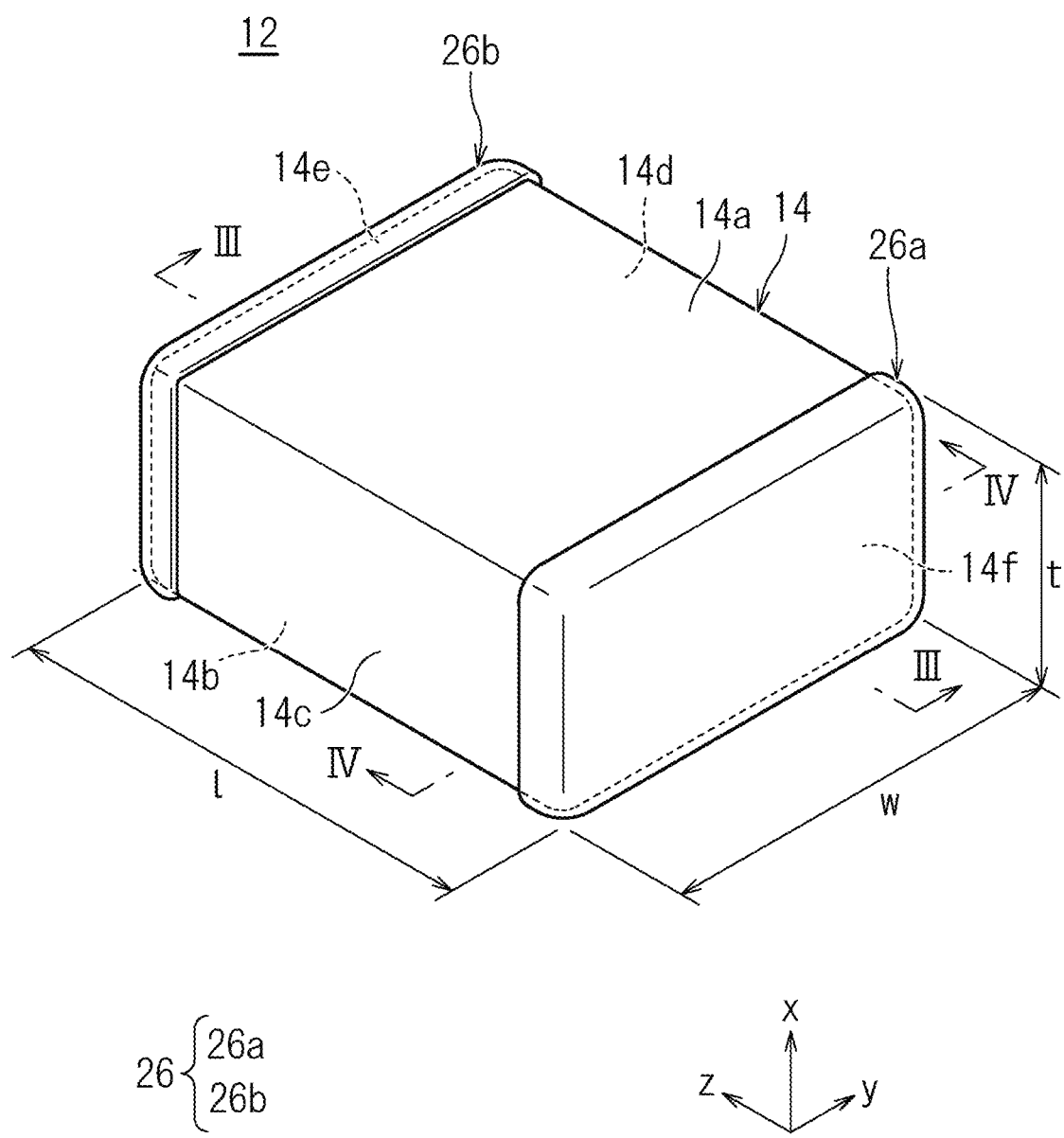
FIG. 2 is a perspective view showing the outer shape of a multilayer ceramic electronic component body that is used in the multilayer ceramic electronic component shown in FIG. 1.
Figure 3:
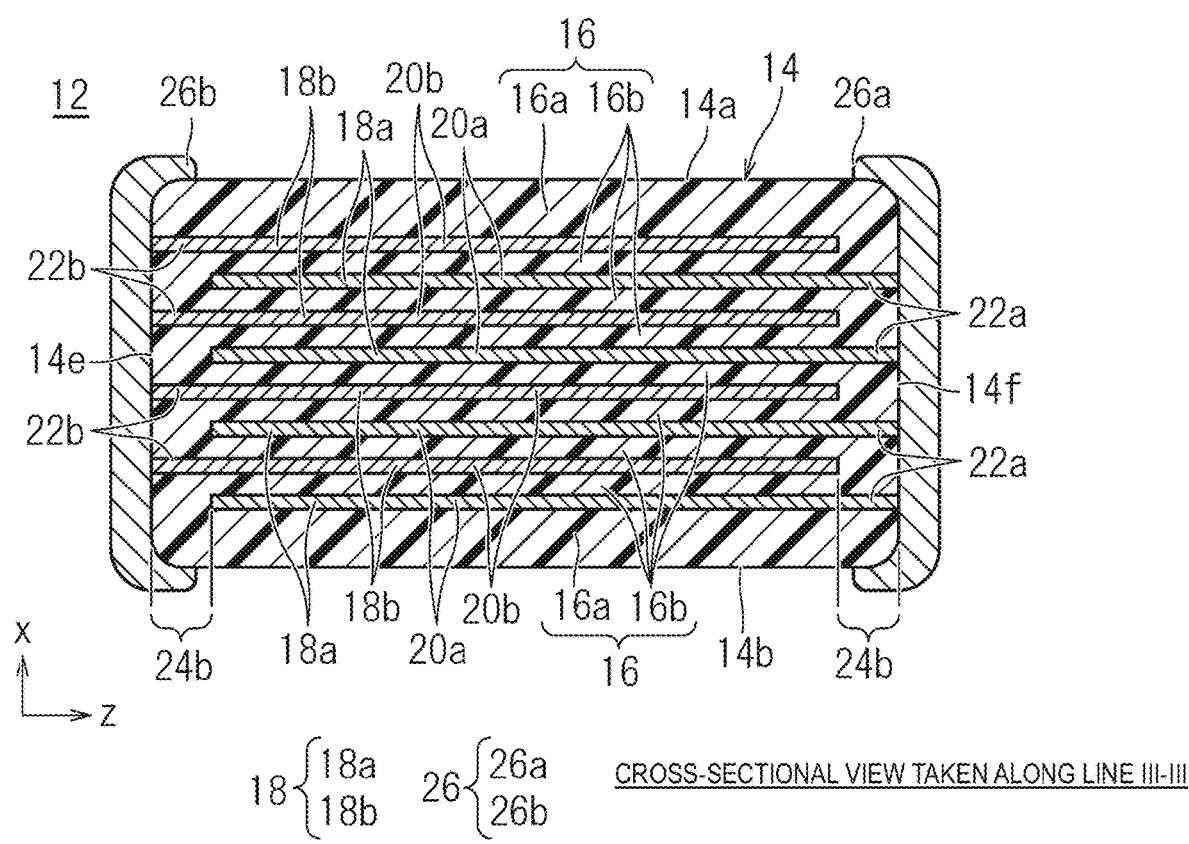
FIG. 3 is a cross-sectional view of the multilayer ceramic electronic component body, taken along the line in FIG. 2.
Figure 4:
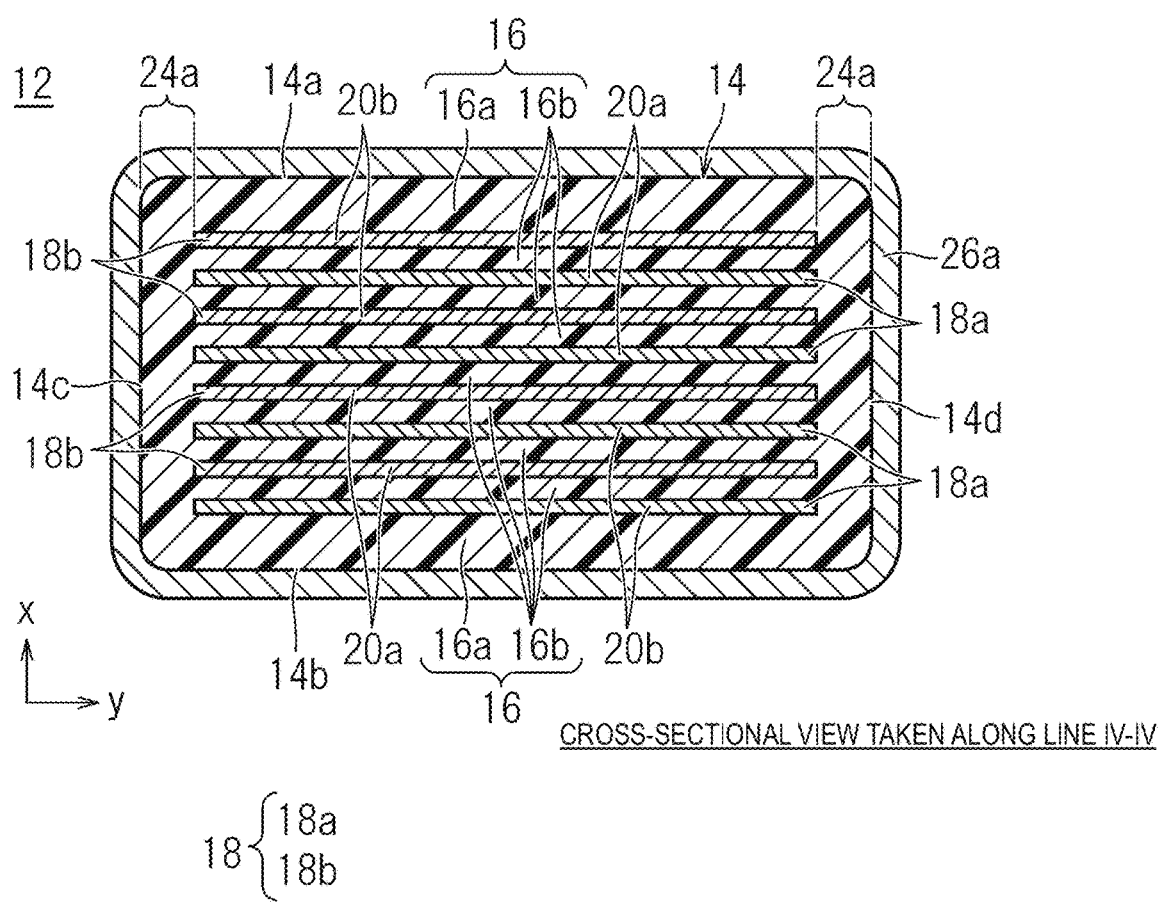
FIG. 4 is a cross-sectional view of the multilayer ceramic electronic component body, taken along the line IV-IV in FIG. 2.
Figure 5:
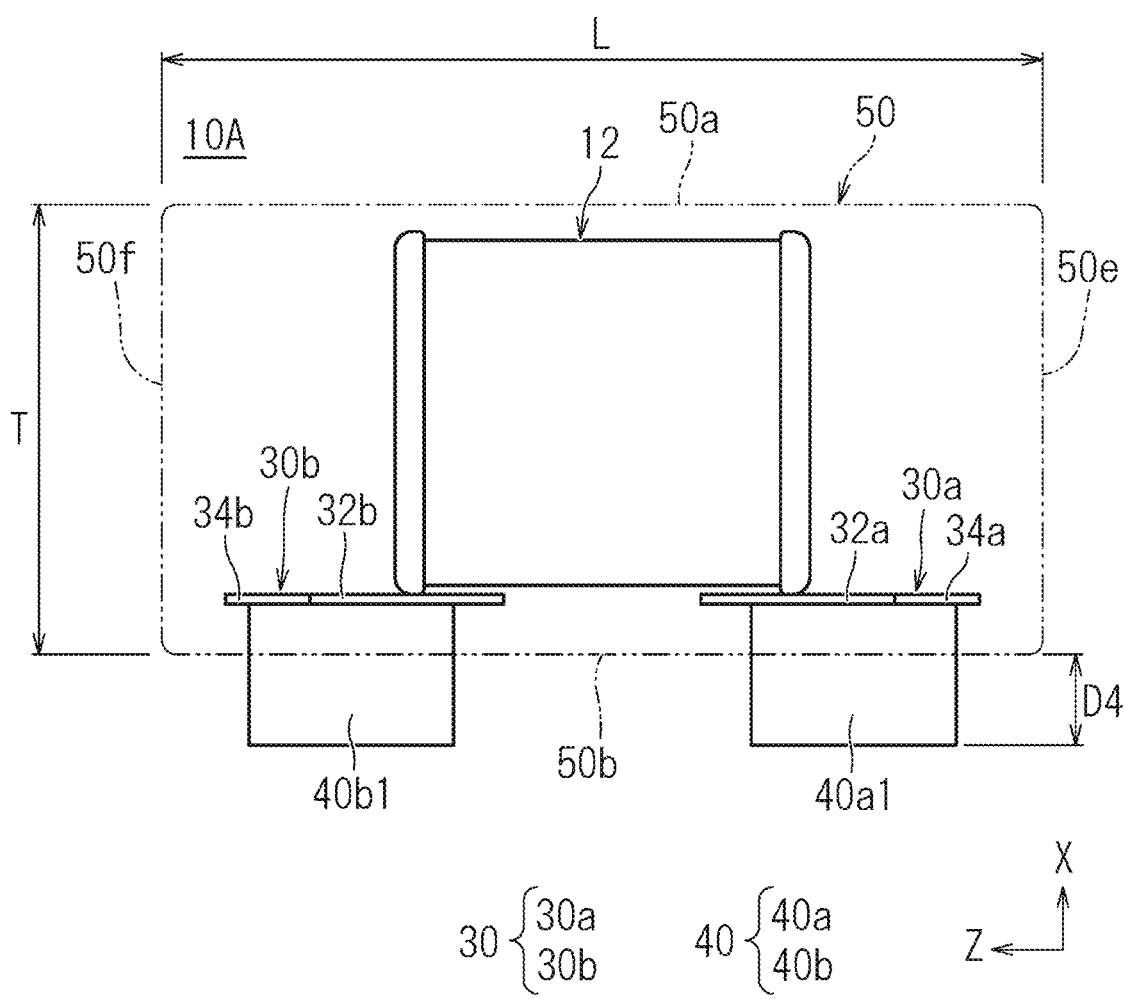
FIG. 5 is a front view of the multilayer ceramic electronic component shown in FIG. 1 showing the multilayer ceramic electronic component according to the first preferred embodiment of the present invention.
Figure 6:
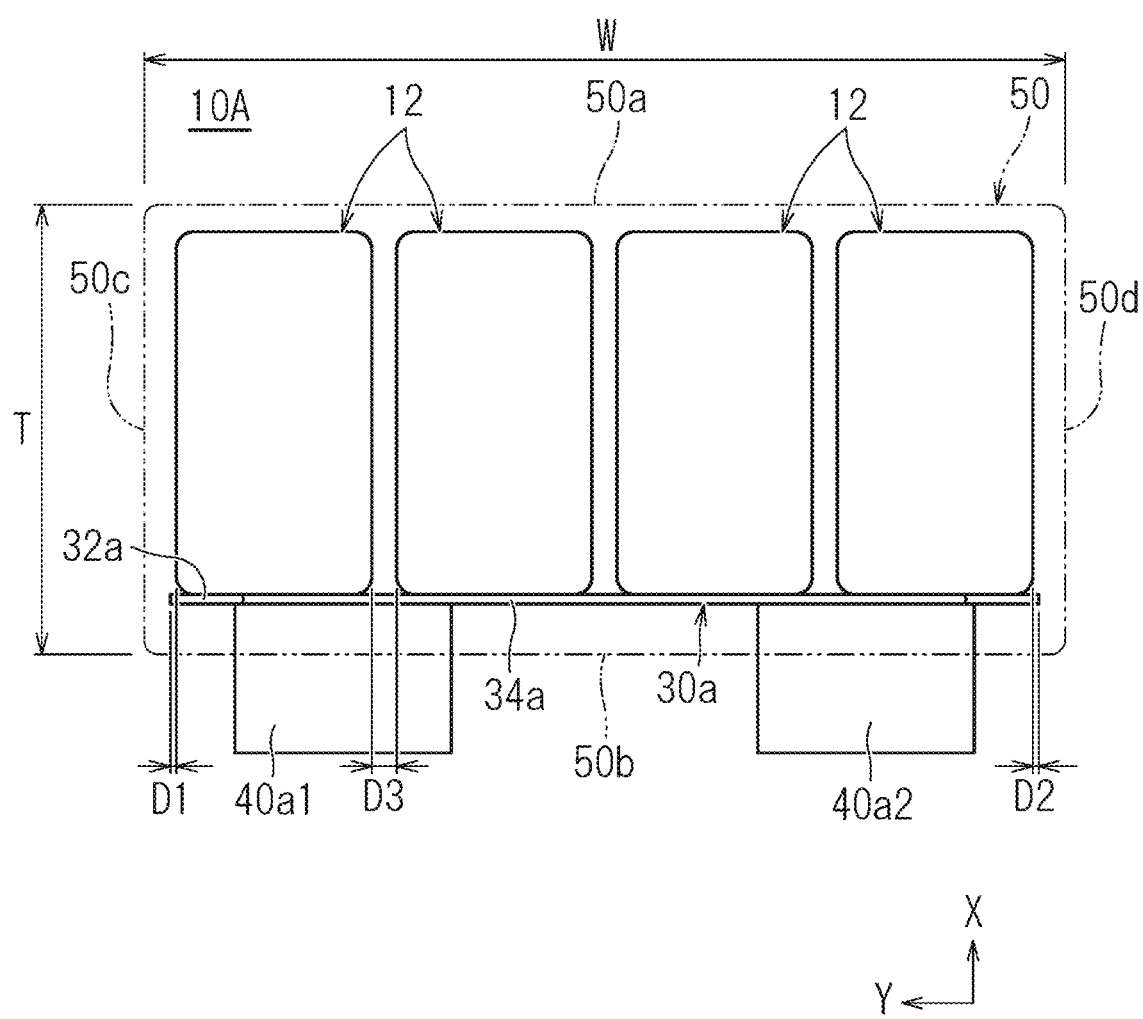
FIG. 6 is a side view of the multilayer ceramic electronic component shown in FIG. 1 showing the multilayer ceramic electronic component according to the first preferred embodiment of the present invention.
Figure 7:
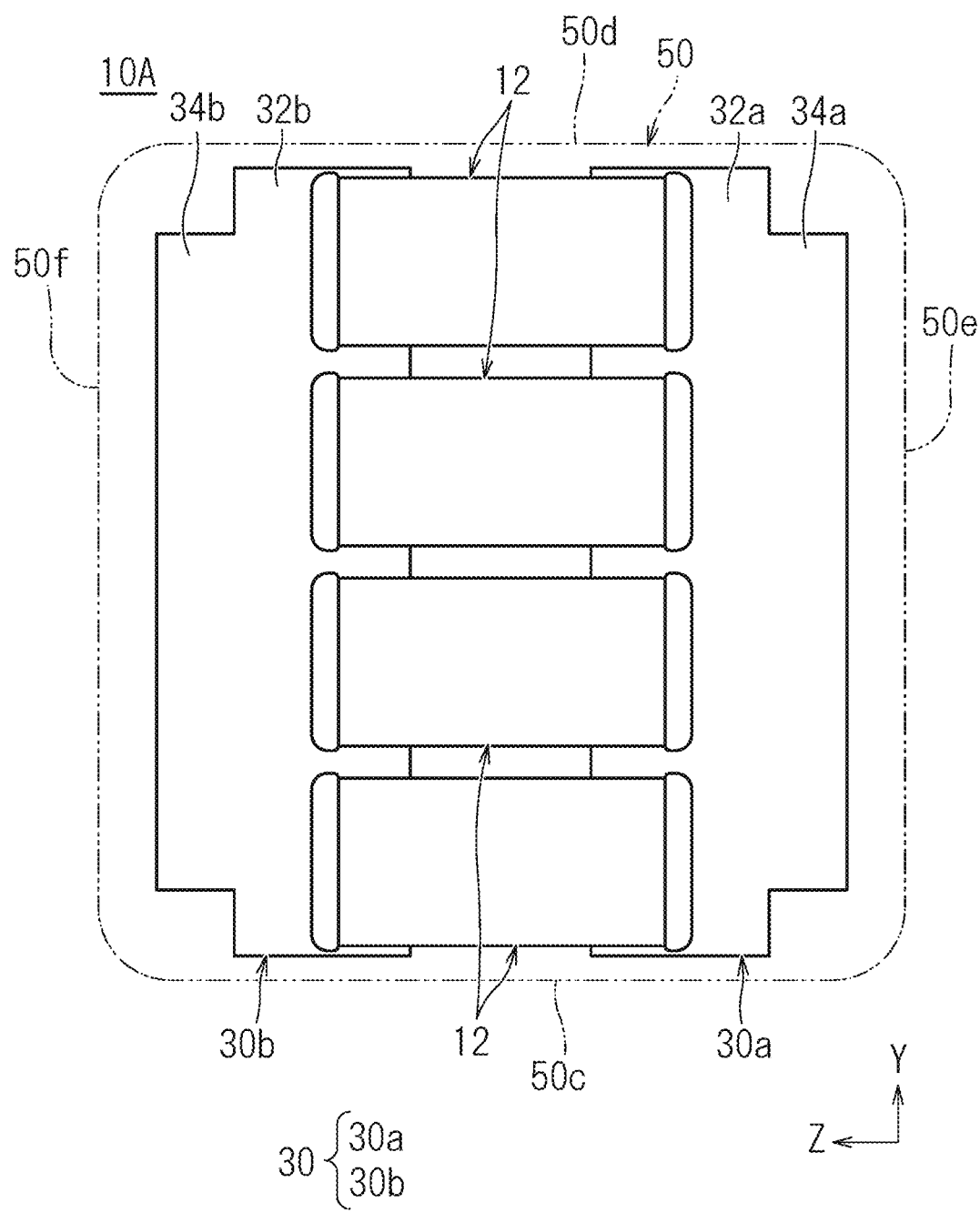
FIG. 7 is a top view of the multilayer ceramic electronic component shown in FIG. 1 showing the multilayer ceramic electronic component according to the first preferred embodiment of the present invention.
Figure 8:
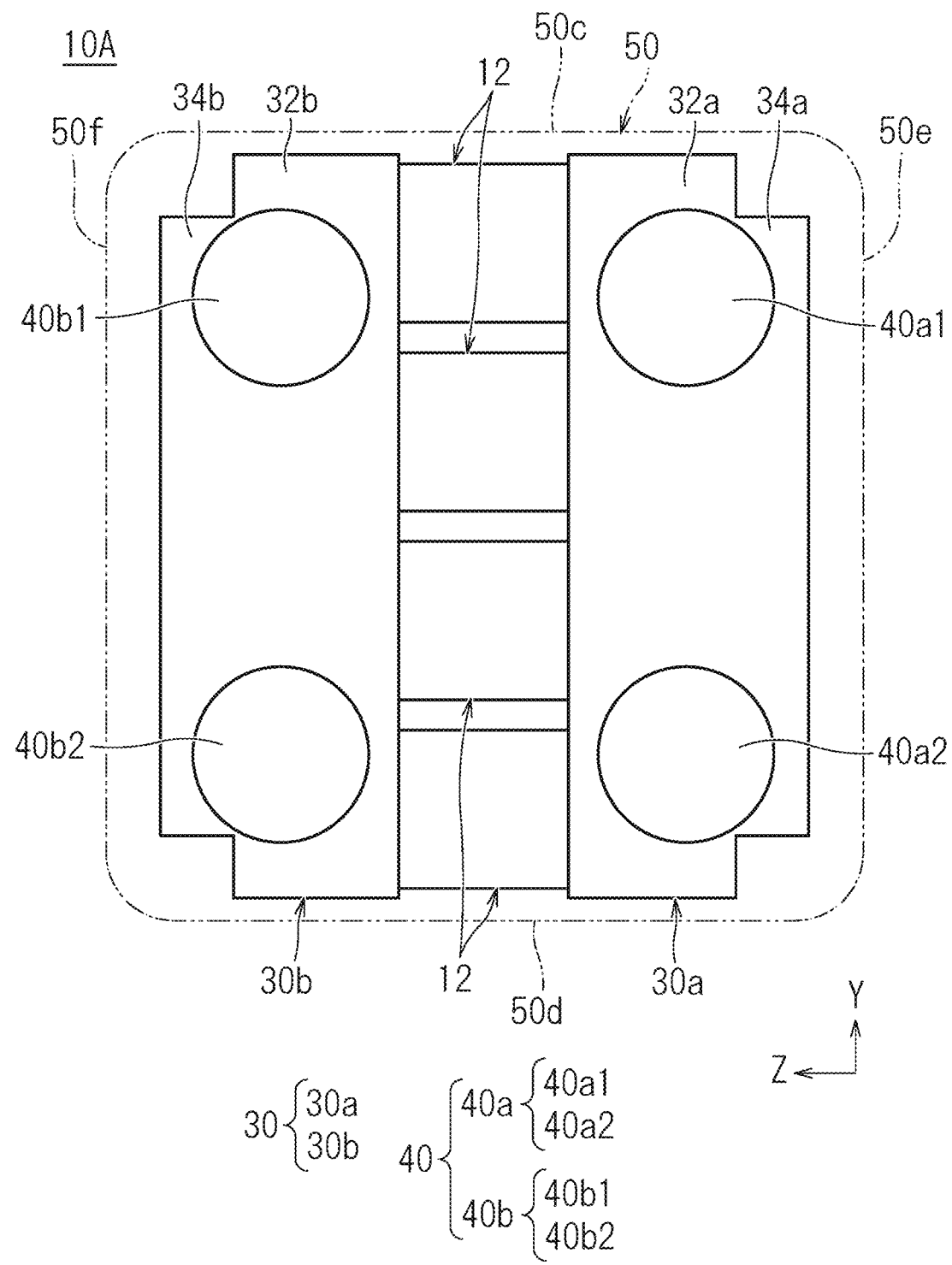
FIG. 8 is a bottom view of the multilayer ceramic electronic component shown in FIG. 1 showing the multilayer ceramic electronic component according to the first preferred embodiment of the present invention.
Figure 9:
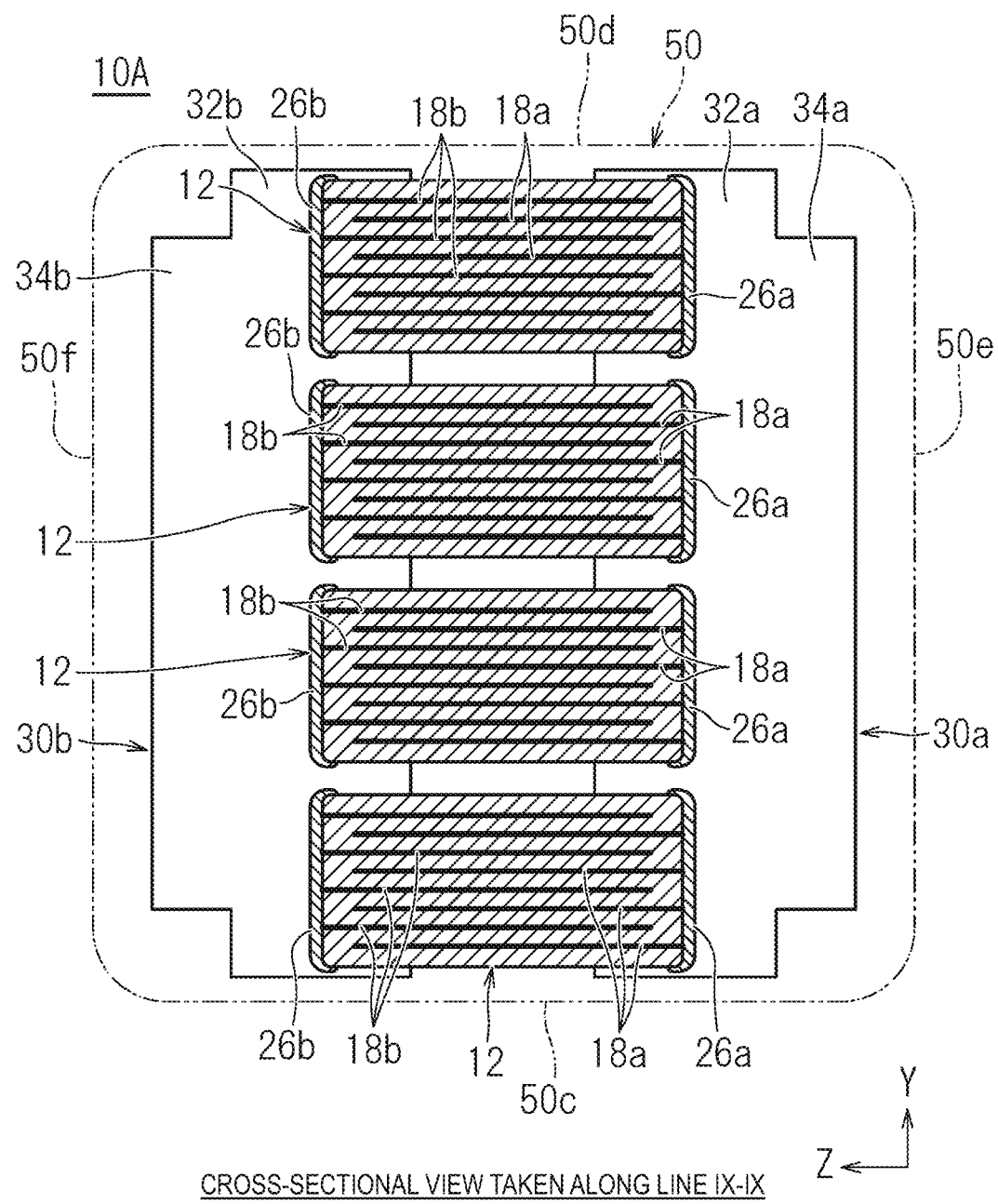
FIG. 9 is a cross-sectional view of the multilayer ceramic electronic component, taken along the line IX-IX in FIG. 1.
Figure 10:
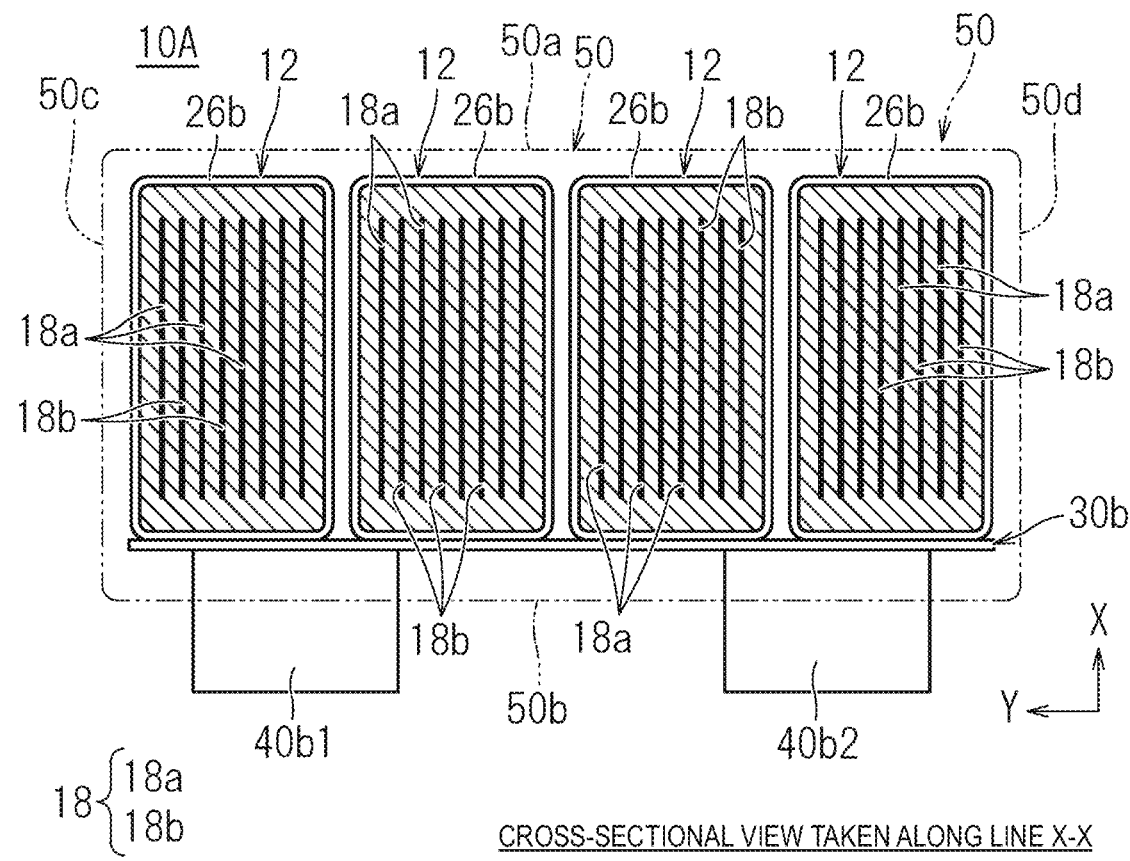
FIG. 10 is a cross-sectional view of the multilayer ceramic electronic component, taken along the line X-X in FIG. 1.
Figure 11:
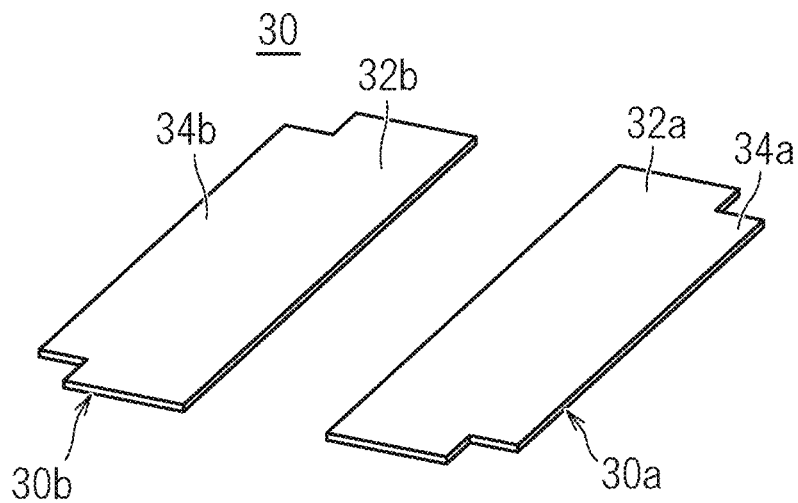
FIG. 11 is an external perspective view showing metal terminals included in the multilayer ceramic electronic component according to the first preferred embodiment of the present invention.

A multilayer ceramic electronic component according to a first preferred embodiment of the present invention will be described. FIG. 1 is an external perspective view showing one example of the multilayer ceramic electronic component according to the first preferred embodiment of the present invention. FIG. 2 is a perspective view showing the outer shape of a multilayer ceramic electronic component body that is used in the multilayer ceramic electronic component shown in FIG. 1. FIG. 3 is a cross-sectional view of the multilayer ceramic electronic component body, taken along the line III-III in FIG. 2. FIG. 4 is a cross-sectional view of the multilayer ceramic electronic component body, taken along the line IV-IV in FIG. 2. FIG. 5 is a front view of the multilayer ceramic electronic component shown in FIG. 1 showing the multilayer ceramic electronic component according to the first preferred embodiment of the present invention. FIG. 6 is a side view of the multilayer ceramic electronic component shown in FIG. 1 showing the multilayer ceramic electronic component according to the first preferred embodiment of the present invention. FIG. 7 is a top view of the multilayer ceramic electronic component shown in FIG. 1 showing the multilayer ceramic electronic component according to the first preferred embodiment of the present invention. FIG. 8 is a bottom view of the multilayer ceramic electronic component shown in FIG. 1 showing the multilayer ceramic electronic component according to the first preferred embodiment of the present invention. FIG. 9 is a cross-sectional view of the multilayer ceramic electronic component, taken along the line IX-IX in FIG. 1. FIG. 10 is a cross-sectional view of the multilayer ceramic electronic component, taken along the line X-X in FIG. 1. FIG. 11 is an external perspective view showing metal terminals included in the multilayer ceramic electronic component according to the first preferred embodiment of the present invention.

Multilayer Ceramic Electronic Component Body

The multilayer ceramic electronic component 10A according to the first preferred embodiment includes a plurality of multilayer ceramic electronic component bodies 12. Each multilayer ceramic electronic component body 12 includes a laminate 14 and outer electrodes 26. The laminate 14 has a rectangular or substantially rectangular parallelepiped shape. The multilayer ceramic electronic component 10A further includes metal terminals 30, terminal blocks 40, and a packaging material 50. The metal terminals 30 are connected to the outer electrodes 26 of each multilayer ceramic electronic component body 12. The terminal blocks 40 are connected to the metal terminals 30. The packaging material 50 covers the laminates 14, the outer electrodes 26, the metal terminals 30, and part of each of the terminal blocks 40.

Each laminate 14 includes a plurality of laminated ceramic layers 16 and a plurality of laminated internal electrode layers 18. Each laminate 14 includes a first main surface 14a, a second main surface 14b, a first side surface 14c, a second side surface 14d, a first end surface 14e, and a second end surface 14f. The first main surface 14a and the second main surface 14b are on opposite sides in a height direction x. The first side surface 14c and the second side surface 14d are on opposite sides in a width direction y perpendicular or substantially perpendicular to the height direction x. The first end surface 14e and the second end surface 14f are on opposite sides in a longitudinal direction z perpendicular or substantially perpendicular to the height direction x and the width direction y. Corners and edges of each laminate 14 are preferably rounded.

The dimension of each multilayer ceramic electronic component body, including the laminate and the outer electrodes, in the longitudinal direction z is defined as an l dimension, the dimension of each multilayer ceramic electronic component body, including the laminate and the outer electrodes, in the height direction x is defined as a thickness dimension, and the dimension of the multilayer ceramic electronic component body, including the laminate and the outer electrodes, in the width direction y is defined as a width dimension.

The corners are portions at which any three adjoining sides of the laminate intersect with one another. The edges are portions at which any two adjoining sides of the laminate intersect with each other. Recesses, projections, or the like, may be provided on a portion or all of the first main surface 14a, the second main surface 14b, the first side surface 14c, the second side surface 14d, the first end surface 14e, and the second end surface 14f. The thickness dimension along the height direction x between the first main surface 14a and second main surface 14b of each multilayer ceramic electronic component body 12 is preferably less than the width dimension along the width direction y between the first side surface 14c and second side surface 14d of the multilayer ceramic electronic component body 12.

Each multilayer ceramic electronic component body 12 is disposed such that the first side surface 14c or the second side surface 14d faces a mounting surface. That is, each multilayer ceramic electronic component body 12 is disposed such that the first side surface 14c or the second side surface 14d in which the internal electrode layers 18 face one another and of which the area is small faces the mounting surface. In this way, when the face having a small area is disposed on the mounting surface, a mounting area can be reduced.

The laminate 14 includes outer layer portions 16a and an inner layer portion 16b. Each of the outer layer portions 16a is defined by the plurality of ceramic layers 16. The inner layer portion 16b is defined by the one or a plurality of ceramic layers 16 and the plurality of internal electrode layers 18 respectively disposed on top of the one or plurality of ceramic layers 16. The outer layer portions 16a are respectively located at the first main surface 14a and second main surface 14b of the laminate 14. One of the outer layer portions 16a is an aggregate of the plurality of ceramic layers 16 located between the first main surface 14a and the internal electrode layer 18 closest to the first main surface 14a. The other one of the outer layer portions 16a is an aggregate of the plurality of ceramic layers 16 located between the second main surface 14b and the internal electrode layer 18 closest to the second main surface 14b. A region sandwiched by both the outer layer portions 16a is the inner layer portion 16b.

Each ceramic layer 16 may preferably be made of, for example, a dielectric material. Examples of the dielectric material include dielectric ceramics containing an ingredient, such as $BaTiO_3$, $CaTiO_3$, $SrTiO_3$, and $CaZrO_3$. When the above-described dielectric material is included as a main ingredient, dielectric ceramics to which a secondary ingredient whose content is less than the main ingredient, such as an Mn compound, an Fe compound, a Cr compound, a Co compound, and an Ni compound, is added based on desired characteristics of the laminate 14 may be used.

When piezoelectric ceramics is used for the laminate 14, the multilayer ceramic electronic component body defines and functions as a ceramic piezoelectric element. Specific examples of the piezoelectric ceramic material include a lead zirconate titanate (PZT) ceramic material.

When semiconductor ceramics is used for the laminate 14, the multilayer ceramic electronic component body defines and functions as a thermistor element. Specific examples of the semiconductor ceramic material include a spinel ceramic material.

When magnetic ceramics is used for the laminate 14, the multilayer ceramic electronic component body defines and functions as an inductor element. When the multilayer ceramic electronic component body defines and functions as an inductor element, the internal electrode layers 18 are substantially coil-shaped conductors. Specific examples of the magnetic ceramic material include a ferrite ceramic material.

The thickness of each ceramic layer 16 after firing is preferably, for example, greater than or equal to about 0.5 µm and less than or equal to about 10.0 µm.

The laminate 14 preferably includes, for example, a plurality of rectangular or substantially rectangular first internal electrode layers 18a and a plurality of rectangular or substantially rectangular second internal electrode layers 18b as the plurality of internal electrode layers 18. The first internal electrode layers 18a and the second internal electrode layers 18b are buried so as to be disposed alternately at equal or substantially equal intervals along the height direction x of the laminate 14.

Each first internal electrode layer 18a includes a first facing electrode portion 20a and a first extended electrode portion 22a. The first facing electrode portion 20a faces corresponding one or two of the second internal electrode layers 18b. The first extended electrode portion 22a is located at one end of the first internal electrode layer 18a, and extends from the first facing electrode portion 20a to the first end surface 14e of the laminate 14. An end portion of the first extended electrode portion 22a is extended to the first end surface 14e and is exposed.

Each second internal electrode layer 18b includes a second facing electrode portion 20b and a second extended electrode portion 22b. The second facing electrode portion 20b faces corresponding one or two of the first internal electrode layers 18a. The second extended electrode portion 22b is located at one end of the second internal electrode layer 18b, and extends from the second facing electrode portion 20b to the second end surface 14f of the laminate 14. An end portion of the second extended electrode portion 22b is extended to the second end surface 14f, and is exposed.

The laminate 14 includes side portions (W gaps) 24a. One of the side portions 24a is provided between the first side surface 14c and one ends of the first facing electrode portions 20a and second facing electrode portions 20b in the width direction y. The other one of the side portions 24a is provided between the second side surface 14d and the other ends of the first facing electrode portions 20a and second facing electrode portions 20b in the width direction y. Furthermore, the laminate 14 includes end portions (L gaps) 24b of the laminate 14. One of the end portions 24b is provided between the first end surface 14e and the ends of the first internal electrode layers 18a away from the first extended electrode portions 22a. The other one of the end portions 24b is provided between the second end surface 14f and the ends of the second internal electrode layers 18b away from the second extended electrode portions 22b.

Each internal electrode layer 18 includes an appropriate electrically conductive material that is, for example, a metal such as Ni, Cu, Ag, Pd, and Au or an alloy containing at least one of those metals, such as Ag—Pd alloy.

The thickness of each internal electrode layer 18 is preferably, for example, greater than or equal to about 0.1 μm and less than or equal to about 2.0 μm.

The outer electrodes 26 are respectively disposed on the first end surface 14e and second end surface 14f of the laminate 14. The outer electrodes 26 include a first outer electrode 26a and a second outer electrode 26b.

The first outer electrode 26a is preferably disposed on the laminate 14 so as to lie on the second end surface 14f and reach at least a portion of the first side surface 14c and at least a portion of the second side surface 14d. In this case, the first outer electrode 26a is electrically connected to the first extended electrode portions 22a of the first internal electrode layers 18a. Alternatively, the first outer electrode 26a may be provided only on the second end surface 14f of the laminate 14.

The second outer electrode 26b is preferably disposed on the laminate 14 so as to lie on the first end surface 14e and reach at least a portion of the first side surface 14c and at least a portion of the second side surface 14d. In this case, the second outer electrode 26b is electrically connected to the second extended electrode portions 22b of the second internal electrode layers 18b. Alternatively, the second outer electrode 26b may be provided only on the first end surface 14e of the laminate 14.

In the laminate 14, the first facing electrode portion 20a of each first internal electrode layer 18a and the second facing electrode portion 20b of at least any one of the second internal electrode layers 18b face each other via the ceramic layer 16, with the result that electrostatic capacitance is produced. Therefore, electrostatic capacitance is obtained between the first outer electrode 26a to which the first internal electrode layers 18a are connected and the second outer electrode 26b to which the second internal electrode layers 18b are connected, so the characteristics of the capacitor are developed.

Each outer electrode 26 includes a base electrode layer and a plating layer in order from the laminate 14 side. Each base electrode layer preferably includes, for example, at least one selected from among a baked layer, a resin layer, a thin film layer, and other layers.

First, the case where each base electrode layer is a baked layer will be described.

The baked layer preferably includes glass and metal. Examples of the metal for the baked layer include at least one selected from among Cu, Ni, Ag, Pd, Ag—Pd alloy, Au, and the like. Examples of the glass for the baked layer include at least one selected from among B, Si, Ba, Mg, Al, Li, and the like. A ceramic material of the same type as that of each ceramic layer 16 may be used instead of glass. Each baked layer may be defined by multiple layers. The baked layers are formed by applying electrically conductive paste containing glass and metal onto the laminate 14 and then baking the paste. The baked layers may be fired at the same time with the ceramic layers 16 and the internal electrode layers 18 or may be baked after the ceramic layers 16 and the internal electrode layers 18 are fired.

The thickness of the baked layer (thickest portion) of the base electrode layer located on the first end surface 14e and the thickness of the baked layer (thickest portion) of the base electrode layer located on the second end surface 14f are preferably, for example, greater than or equal to about 20 μm and less than or equal to about 100 μm.

The thickness of the baked layer of the base electrode layer located on the first end surface 14e at the center portion of the base electrode layer in the height direction t and the thickness of the baked layer of the base electrode layer located on the second end surface 14f at the center portion of the base electrode layer in the height direction t are preferably, for example, greater than or equal to about 20 μm and less than or equal to about 100 μm.

When the base electrode layers are provided on the surfaces of the first main surface 14a, the second main surface 14b, the first side surface 14c, and the second side surface 14d, the thickness of the baked layer of the base electrode layer located on the surfaces of the first main surface 14a, the second main surface 14b, the first side surface 14c, and the second side surface 14d at the center portion of the base electrode layer in the longitudinal direction z and the thickness of the baked layer of the other base electrode layer located on the surfaces of the first main surface 14a, the second main surface 14b, the first side surface 14c, and the second side surface 14d at the center portion of the base electrode layer in the longitudinal direction z are preferably, for example, greater than or equal to about 10 μm and less than or equal to about 50 μm.

Next, the case where each base electrode layer is a resin layer will be described.

When the resin layer is provided, the resin layer may be provided on the surface of the baked layer or may be directly formed on the surface of the first end surface 14e or second end surface 14f of the laminate 14 without the baked layer being formed. The resin layer preferably includes electrically conductive particles and a thermosetting resin. Each resin layer may be defined by multiple layers.

The thickness of the resin layer (thickest portion) located on the first end surface 14e and the thickness of the resin layer (thickest portion) located on the second end surface 14f are preferably, for example, greater than or equal to about 10 µm and less than or equal to about 150 µm.

The thickness of the resin layer located on the first end surface 14e at the center portion of the resin layer in the height direction and the thickness of the resin layer located on the second end surface 14f at the center portion of the resin layer in the height direction are preferably, for example, greater than or equal to about 10 µm and less than or equal to about 150 µm.

When the resin layers are provided on the surfaces of the first main surface 14a, the second main surface 14b, the first side surface 14c, and the second side surface 14d, the thickness of the resin layer located on the surfaces of the first main surface 14a, the second main surface 14b, the first side surface 14c, and the second side surface 14d at the center portion of the resin layer in the longitudinal direction z and the thickness of the other resin layer located on the surfaces of the first main surface 14a, the second main surface 14b, the first side surface 14c, and the second side surface 14d at the center portion of the resin layer in the longitudinal direction z are preferably, for example, greater than or equal to about 10 µm and less than or equal to about 100 µm.

When each base electrode layer is a thin film layer, the thin film layer is preferably formed by a thin film formation method, such as sputtering and vapor deposition, for example. The thin film layer is a layer of deposited metal particles and preferably has, for example, a thickness of less than or equal to about 1 µm.

Each plating layer is disposed so as to cover a corresponding one of the base electrode layers. Examples of the plating layer include at least one selected from among Cu, Ni, Sn, Ag, Pd, Ag—Pd alloy, Au, and the like. Each plating layer may be defined by multiple layers. In this case, each plating layer preferably has a double-layer structure of an Ni-plating layer and an Sn-plating layer, for example. When the Ni-plating layer is provided so as to cover each base electrode layer, erosion of each base electrode layer by solder that is used for bonding is prevented at the time when the multilayer ceramic electronic component bodies 12 are bonded to each metal terminal 30. When the Sn-plating layer is provided on the surface of the Ni-plating layer, wettability of solder that is used for bonding is improved at the time of bonding the multilayer ceramic electronic component bodies 12 to the metal terminals 30, so the multilayer ceramic electronic component bodies 12 are easily mounted.

The thickness of each plating layer is preferably, for example, greater than or equal to about 1 µm and less than or equal to about 15 µm.

The thickness of the plating layer located on the first end surface 14e at the center portion of the plating layer in the height direction and the thickness of the plating layer located on the second end surface 14f at the center portion of the plating layer in the height direction are preferably, for example, greater than or equal to about 1 µm and less than or equal to about 15 µm.

When the plating layers are provided on the surfaces of the first main surface 14a, the second main surface 14b, the first side surface 14c, and the second side surface 14d, the thickness of the plating layer located on the surfaces of the first main surface 14a, the second main surface 14b, the first side surface 14c, and the second side surface 14d at the center portion of the plating layer in the longitudinal direction z and the thickness of the other plating layer located on the surfaces of the first main surface 14a, the second main surface 14b, the first side surface 14c, and the second side surface 14d at the center portion of the plating layer in the longitudinal direction z are preferably, for example, greater than or equal to about 1 µm and less than or equal to about 15 µm.

The outer electrodes 26 may optionally include only the plating layers without providing the base electrode layers. Hereinafter, the structure that the plating layers are provided without the base electrode layers will be described.

Each of the first outer electrode 26a and the second outer electrode 26b may be structured such that no base electrode layer is provided and the plating layers are directly formed on the surface of the laminate 14. That is, each multilayer ceramic electronic component body 12 may include the plating layers that are electrically connected to the first internal electrode layers 18a or the second internal electrode layers 18b. In such a case, the plating layers may be formed after a catalyst is placed on the surface of the laminate 14 as pretreatment.

Each plating layer preferably includes a lower-layer plating electrode provided on the surface of the laminate 14 and an upper-layer plating electrode provided on the surface of the lower-layer plating electrode.

Examples of each of the lower-layer plating electrode and the upper-layer plating electrode preferably include at least one metal that is selected from among Cu, Ni, Sn, Pb, Au, Ag, Pd, Bi, Zn, and the like, or an alloy of some of the metals.

Each lower-layer plating electrode is preferably formed using Ni having solder barrier capabilities. Each upper-layer plating electrode is preferably formed using Sn or Au having good wettability. For example, when the first internal electrode layers 18a and the second internal electrode layers 18b are made of Ni, each lower-layer plating electrode is preferably made of Cu, for example, having good adhesion to Ni. Each upper-layer plating electrode may be provided as needed. Each of first outer electrode 26a and the second outer electrode 26b may be defined by only the lower-layer plating electrode.

Each plating layer may include the upper-layer plating electrode as an outermost layer, or further another plating electrode may be provided on the surface of the upper-layer plating electrode.

The thickness per layer of each plating layer disposed without any base electrode layer is preferably, for example, greater than or equal to about 1 µm and less than or equal to about 15 µm. Each plating layer preferably does not contain glass. The percentage of metal in each plating layer per unit volume is preferably, for example, higher than or equal to about 99 percent by volume.

In the multilayer ceramic electronic component 10A, the plurality of multilayer ceramic electronic component bodies 12 is disposed side by side such that the main surfaces of the adjacent multilayer ceramic electronic component bodies 12 face each other. Here, a direction connecting the first side surface 14c and second side surface 14d of each multilayer ceramic electronic component body 12 is defined as a height direction X of the multilayer ceramic electronic component 10A, a direction connecting the first main surface 14a and second main surface 14b of each multilayer ceramic electronic component body 12 is defined as a width direction Y of the multilayer ceramic electronic component 10A, and a direction connecting the first end surface 14e and second end surface 14f of each multilayer ceramic electronic component body 12 is defined as a longitudinal direction Z of the multilayer ceramic electronic component 10A.

The packaging material 50 that will be described in detail later preferably includes a first main surface 50a, a second main surface 50b, a first side surface 50c, a second side surface 50d, a first end surface 50e, and a second end surface 50f. The first main surface 50a and the second main surface 50b face the first side surfaces 14c and second side surfaces 14d of the multilayer ceramic electronic component bodies 12. The first side surface 50c and the second side surface 50d face the first main surfaces 14a and second main surfaces 14b of the multilayer ceramic electronic component bodies 12. The first end surface 50e and the second end surface 50f face the first end surfaces 14e and second end surfaces 14f of the multilayer ceramic electronic component bodies 12.

Metal Terminals

The metal terminals 30 are connected to the outer electrodes 26 disposed on both end surfaces of plurality of multilayer ceramic electronic component bodies 12, that is, the four multilayer ceramic electronic component bodies 12 in the present preferred embodiment.

The metal terminals 30 include a first metal terminal 30a and a second metal terminal 30b.

The first metal terminal 30a is connected to the first outer electrodes 26a of the plurality of multilayer ceramic electronic component bodies 12 by a bonding material. Specifically, the first metal terminal 30a is connected to the first outer electrode 26a located on the first side surface 14c or second side surface 14d of each of the multilayer ceramic electronic component bodies 12.

The second metal terminal 30b is connected to the second outer electrodes 26b of the plurality of multilayer ceramic electronic component bodies 12. Specifically, the second metal terminal 30b is connected to the second outer electrode 26b located on the first side surface 14c or second side surface 14d of each of the multilayer ceramic electronic component bodies 12.

The metal terminals 30 are provided so as to bond the multilayer ceramic electronic component bodies 12 to the terminal blocks 40. For example, a sheet-shaped or substantially sheet-shaped frame terminal is used for the metal terminals 30. Each of the metal terminals 30 made from a sheet-shaped frame terminal has a first main surface, a second main surface, and a peripheral surface. The first main surface is connected to the outer electrodes 26. The second main surface is on the opposite side of the frame terminal (a face away from the multilayer ceramic electronic component bodies 12). The peripheral surface provides a thickness between the first main surface and the second main surface.

The first metal terminal 30a includes a first terminal bonding portion 32a and a first extended portion 34a. The first terminal bonding portion 32a is connected to the first outer electrodes 26a, and faces the first side surfaces 14c or second side surfaces 14d of the multilayer ceramic electronic component bodies 12. The first extended portion 34a is connected to the first terminal bonding portion 32a, and extends in a direction substantially parallel to the first side surfaces 14c or second side surfaces 14d of the multilayer ceramic electronic component bodies 12 away from the plurality of multilayer ceramic electronic component bodies 12. Thus, the terminal blocks 40 are allowed to be bonded to any locations on the metal terminal lower surface, so the creepage distance of the multilayer ceramic electronic component 10A can be adjusted. The first extended portion 34a may linearly extend or may have a shape curved or bent at multiple portions.

The second metal terminal 30b includes a second terminal bonding portion 32b and a second extended portion 34b. The second terminal bonding portion 32b is connected to the second outer electrodes 26b, and faces the first side surfaces 14c or second side surfaces 14d of the multilayer ceramic electronic component bodies 12. The second extended portion 34b is connected to the second terminal bonding portion 32b, and extends in a direction substantially parallel to the first side surfaces 14c or second side surfaces 14d of the multilayer ceramic electronic component bodies 12 away from the plurality of multilayer ceramic electronic component bodies 12. Thus, the terminal blocks 40 are allowed to be bonded to any locations on the metal terminal lower surface, so the creepage distance of the multilayer ceramic electronic component 10A can be adjusted. The second extended portion 34b may linearly extend or may have a shape curved or bent at multiple portions.

The first metal terminal 30a and the second metal terminal 30b are preferably made of a metal having a coefficient of linear expansion of, for example, less than or equal to about $12 \times 10^{-6}$. Thus, in the present preferred embodiment of the present invention, since the metal terminals 30 made of a metal base material having a coefficient of linear expansion of less than or equal to about $12 \times 10^{-6}$, thermal stress that is generated by the difference in the coefficient of linear expansion between each multilayer ceramic electronic component body 12 and each metal terminal 30 is reduced, so cracks caused by the heat cycle of the multilayer ceramic electronic component 10A are reduced.

A method of measuring a coefficient of linear expansion conforms to JIS Z 2285:2003, and an average coefficient of linear expansion at temperatures higher than or equal to about −55 degrees C. and lower than or equal to about 200 degrees C. is measured. Thus, not only improvement in the heat radiation property of the multilayer ceramic electronic component 10A but also crack reduction of the multilayer ceramic electronic component bodies 12 are achieved.

First Terminal Bonding Portion and Second Terminal Bonding Portion

The first terminal bonding portion 32a of the first metal terminal 30a is a portion bonded to the first outer electrode 26a located on the first side surface 14c or second side surface 14d (mounting surface-side side surface) of each of the multilayer ceramic electronic component bodies 12. The first terminal bonding portion 32a is provided so as to successively connect the plurality of first outer electrodes 26a respectively provided in the plurality of multilayer ceramic electronic component bodies 12. The shape of the first terminal bonding portion 32a of the first metal terminal 30a is not specifically limited. However, the shape of the first terminal bonding portion 32a is preferably a rectangular or substantially rectangular shape with which the first terminal bonding portion 32a is able to successively connect the plurality of first outer electrodes 26a respectively provided in the plurality of multilayer ceramic electronic component bodies 12.

The second terminal bonding portion 32b of the second metal terminal 30b is a portion bonded to the second outer electrode 26b located on the first side surface 14c or second side surface 14d (mounting surface-side side surface) of each of the multilayer ceramic electronic component bodies 12. The second terminal bonding portion 32b is provided so as to successively connect the plurality of second outer electrodes 26b respectively provided in the plurality of multilayer ceramic electronic component bodies 12. The shape of the second terminal bonding portion 32b of the second metal terminal 30b is not specifically limited. However, the shape of the second terminal bonding portion 32b is preferably a rectangular or substantially rectangular shape with which the second terminal bonding portion 32b is able to successively connect the plurality of second outer electrodes 26b respectively provided in the plurality of multilayer ceramic electronic component bodies 12.

As shown in FIG. 1 and FIG. 11, when the first terminal bonding portion 32a has a rectangular or substantially rectangular shape with which the first terminal bonding portion 32a is able to successively connect the first outer electrodes 26a respectively provided in the plurality of multilayer ceramic electronic component bodies 12, the length of the first terminal bonding portion 32a of the first metal terminal 30a in the width direction Y of the multilayer ceramic electronic component 10A is preferably set so as to cover the overall length of the first outer electrodes 26a respectively located on the first side surfaces 14c or second side surfaces 14d (mounting surface-side side surfaces) of the plurality of multilayer ceramic electronic component bodies 12 in the height direction x. Specifically, over the multilayer ceramic electronic component body 12 located closest to the first side surface 50c of the multilayer ceramic electronic component 10A to the multilayer ceramic electronic component body 12 located closest to the second side surface 50d of the multilayer ceramic electronic component 10A, all the first outer electrodes 26a located on the first side surfaces 14c or second side surfaces 14d (mounting surface-side side surfaces) are continuously covered with the single terminal bonding portion. That is, the terminal bonding portion is continuously provided, including any gap between the plurality of multilayer ceramic electronic component bodies 12.

When the second terminal bonding portion 32b has a rectangular or substantially rectangular shape with which the second terminal bonding portion 32b is able to successively connect the second outer electrodes 26b respectively provided in the plurality of multilayer ceramic electronic component bodies 12, the length of the second terminal bonding portion 32b of the second metal terminal 30b in the width direction Y of the multilayer ceramic electronic component 10A is preferably set so as to cover the overall length of the second outer electrodes 26b respectively located on the first side surfaces 14c or second side surfaces 14d (mounting surface-side side surfaces) of the plurality of multilayer ceramic electronic component bodies 12 in the height direction x. Specifically, over the multilayer ceramic electronic component body 12 located closest to the first side surface 50c of the multilayer ceramic electronic component 10A to the multilayer ceramic electronic component body 12 located closest to the second side surface 50d of the multilayer ceramic electronic component 10A, all the second outer electrodes 26b located on the first side surfaces 14c or second side surfaces 14d (mounting surface-side side surfaces) are continuously covered with the single terminal bonding portion. That is, the terminal bonding portion is continuously provided, including any gap between the plurality of multilayer ceramic electronic component bodies 12.

At this time, one end of the first terminal bonding portion 32a of the first metal terminal 30a, located near the multilayer ceramic electronic component body 12 closest to the first side surface 50c of the multilayer ceramic electronic component 10A, is preferably provided so as to project, for example, by a dimension D1 of greater than or equal to about 0.05 mm and less than or equal to about 0.25 mm from the left end of the first outer electrode 26a located on the first side surface 14c or second side surface 14d (mounting surface-side side surface) of the multilayer ceramic electronic component body 12 closest to the first side surface 50c of the multilayer ceramic electronic component 10A.

Similarly, the other end of the first terminal bonding portion 32a of the first metal terminal 30a, located near the multilayer ceramic electronic component body 12 closest to the second side surface 50d of the multilayer ceramic electronic component 10A, is preferably provided so as to project, for example, by a dimension D2 of greater than or equal to about 0.05 mm and less than or equal to about 0.25 mm from the right end of the first outer electrode 26a located on the first side surface 14c or second side surface 14d (mounting surface-side side surface) of the multilayer ceramic electronic component body 12 located closest to the second side surface 50d of the multilayer ceramic electronic component 10A.

Furthermore, the relationship between the second terminal bonding portion 32b of the second metal terminal 30b and each second outer electrode 26b is also preferably substantially the same or similar.

Thus, the bonding area between each multilayer ceramic electronic component body 12 and each metal terminal 30 is maintained constant, so bonding strength and the resistance value of each metal terminal 30 can be regulated within a set range.

The length of the first terminal bonding portion 32a of the first metal terminal 30a in the longitudinal direction Z of the multilayer ceramic electronic component 10A (the direction connecting the first end surface 50e and the second end surface 50f) may be substantially equivalent to the length of each first outer electrode 26a located on the first side surface 14c or second side surface 14d (mounting surface-side side surface) in the longitudinal direction z connecting the first end surface 14e and second end surface 14f of the multilayer ceramic electronic component body 12, may be less than the length of each first outer electrode 26a, or may be greater than the length of each first outer electrode 26a.

The length of the second terminal bonding portion 32b of the second metal terminal 30b in the longitudinal direction Z of the multilayer ceramic electronic component 10A (the direction connecting the first end surface 50e and the second end surface 50f) may be substantially equivalent to the length of each second outer electrode 26b located on the first side surface 14c or second side surface 14d (mounting surface-side side surface) in the longitudinal direction z connecting the first end surface 14e and second end surface 14f of the multilayer ceramic electronic component body 12, may be less than the length of each second outer electrode 26b, or may be greater than the length of each second outer electrode 26b.

First Extended Portion and Second Extended Portion

The first extended portion 34a of the first metal terminal 30a extends from the first terminal bonding portion 32a in a direction parallel or substantially parallel to the first side surfaces 14c or the second side surfaces 14d (mounting surface-side side surfaces) away from the plurality of multilayer ceramic electronic component bodies 12. The first extended portion 34a may linearly extend or may have a shape curved or bent at multiple portions, for example.

The second extended portion 34b of the second metal terminal 30b extends from the second terminal bonding portion 32b in a direction parallel or substantially parallel to the first side surfaces 14c or the second side surfaces 14d (mounting surface-side side surfaces) away from the plurality of multilayer ceramic electronic component bodies 12. The second extended portion 34b may linearly extend or may have a shape curved or bent at multiple portions, for example.

Each metal terminal 30 includes a terminal body and a plating film formed on the surface of the terminal body.

It is preferable that the terminal body is made of, for example, any one of Ni, Fe, Cu, Ag, Cr, or an alloy containing one or more of these metals as main ingredients. It is preferable that the terminal body is selected from among, for example, a stainless alloy, a titanium alloy, and a nickel alloy. Thus, the coefficient of linear expansion is maintained low while workability is ensured and elasticity for easing stress from a mounting board is imparted. The thickness of the terminal body of each metal terminal 30 is preferably, for example, greater than or equal to about 0.05 mm and less than or equal to about 0.5 mm.

Each plating film preferably includes a lower-layer plating film and an upper-layer plating film. The lower-layer plating film is provided on the surface of the terminal body. The upper-layer plating film is provided on the surface of the lower-layer plating film. Each of the lower-layer plating film and the upper-layer plating film may be defined by a plurality of plating films.

The lower-layer plating film is preferably made of, for example, any one of Ni, Fe, Cu, Ag, Cr, or an alloy containing one or more of these metals as main ingredients. The lower-layer plating film is preferably made of, for example, any one of Ni, Fe, Cr, or an alloy containing one or more of these metals as a main ingredient.

The thickness of the lower-layer plating film is preferably, for example, greater than or equal to about 0.2 µm and less than or equal to about 5.0 µm.

The upper-layer plating film is preferably made of, for example, any one of Sn, Ag, Au, or an alloy containing one or more of these metals as main ingredients. The upper-layer plating film is preferably made of, for example, Sn or an alloy containing Sn as a main ingredient. When the upper-layer plating film is made of Sn or an alloy containing Sn as a main ingredient, solderability between each metal terminal 30 and the corresponding outer electrodes 26 is improved.

The thickness of the upper-layer plating film is preferably, for example, greater than or equal to about 1.0 µm and less than or equal to about 5.0 µm.

When each of the terminal body and the lower-layer plating film is made of any one of Ni, Fe, and Cr having a high melting point or an alloy containing one or more of these metals as main ingredients, the heat resistance of each outer electrode 26 is improved.

The plating film does not need to be provided at least on the peripheral surfaces of the first terminal bonding portion 32a and first extended portion 34a of the first metal terminal 30a and the peripheral surfaces of the second terminal bonding portion 32b and second extended portion 34b of the second metal terminal 30b. Thus, spreading of solder to the multilayer ceramic electronic component bodies 12 at the time of bonding the metal terminals 30 to the terminal blocks 40 is reduced. Therefore, since supply of unnecessary solder is reduced, development of cracks caused by solder stress in the multilayer ceramic electronic component bodies 12 is reduced, so a good bonding state is maintained between each multilayer ceramic electronic component body 12 and each metal terminal 30.

When no plating film is provided at least on the peripheral surfaces of the first terminal bonding portion 32a and first extended portion 34a of the first metal terminal 30a and the peripheral surfaces of the second terminal bonding portion 32b and second extended portion 34b of the second metal terminal 30b, flow of solder, which bonds the multilayer ceramic electronic component bodies 12 to the metal terminals 30, to the back surfaces of the metal terminals 30 is also reduced. Thus, shortage of solder can be reduced, so a good bonding state is maintained between each multilayer ceramic electronic component body 12 and each metal terminal 30.

When the plating films on all the peripheral surfaces of the first terminal bonding portion 32a and first extended portion 34a of the first metal terminal 30a and all the peripheral surfaces of the second terminal bonding portion 32b and second extended portion 34b of the second metal terminal 30b are removed, a method of, for example, removing the plating films may include mechanical removal (cutting or grinding) or removal by laser trimming, removal with a plating remover (for example, sodium hydroxide), and removal with a method in which portions where no plating is formed are covered with a resist before formation of plating films on the metal terminals 30 and then the resist is removed after formation of the plating films on the metal terminals 30.

Terminal Block

The terminal blocks 40 preferably includes a first terminal block 40a and a second terminal block 40b.

One or a plurality of the first terminal blocks 40a are provided. When the plurality of first terminal blocks 40a are provided, the number of heat radiation paths is increased, so the heat radiation property of the terminal blocks 40 is further improved. In the multilayer ceramic electronic component 10A according to the present preferred embodiment, two terminal blocks, that is, a first terminal block 40a1 and a first terminal block 40a2, are provided, and each preferably have, for example, a cylindrical or substantially cylindrical columnar shape.

Similarly, one or a plurality of the second terminal blocks 40b are provided. When the plurality of second terminal blocks 40b are provided, the number of heat radiation paths is increased, so the heat radiation property of the terminal blocks 40 is further improved. In the multilayer ceramic electronic component 10A according to the present preferred embodiment, two terminal blocks, that is, a second terminal block 40b1 and a second terminal block 40b2, are provided, and each preferably have, for example, a cylindrical or substantially cylindrical columnar shape.

The first terminal block 40a1 and the first terminal block 40a2 are connected to the first metal terminal 30a. The first terminal block 40a1 is disposed astride the first terminal bonding portion 32a and first extended portion 34a of the first metal terminal 30a near the first side surface 50c. The first terminal block 40a2 is disposed astride the first terminal bonding portion 32a and first extended portion 34a of the first metal terminal 30a near the second side surface 50d. Thus, the thermal resistance of the heat radiation paths from the multilayer ceramic electronic component bodies 12 to the board decreases, so the heat radiation property is improved. Alternatively, the first terminal block 40a1 and the first terminal block 40a2 may be disposed so as to be connected to only the first terminal bonding portion 32*a* of the first metal terminal 30*a* or may be connected to only the first extended portion 34*a*.

The second terminal block 40*b*1 and the second terminal block 40*b*2 are connected to the second metal terminal 30*b*. The second terminal block 40*b*1 is disposed astride the second terminal bonding portion 32*b* and second extended portion 34*b* of the second metal terminal 30*b* near the first side surface 50*c*. The second terminal block 40*b*2 is disposed astride the second terminal bonding portion 32*b* and second extended portion 34*b* of the second metal terminal 30*b* near the second side surface 50*d*. Thus, the thermal resistance of the heat radiation paths from the multilayer ceramic electronic component bodies 12 to the board decreases, so the heat radiation property is improved. Alternatively, the second terminal block 40*b*1 and the second terminal block 40*b*2 may be disposed so as to be connected to only the second terminal bonding portion 32*b* of the second metal terminal 30*b* or may be connected to only the second extended portion 34*b*.

The diameter of each of the first terminal blocks 40*a*1, 40*a*2 and second terminal blocks 40*b*1, 40*b*2 is not specifically limited, and is adjusted as needed for the size of the multilayer ceramic electronic component 10A. When the shape of each of the first terminal blocks 40*a*1, 40*a*2 and second terminal blocks 40*b*1, 40*b*2 is, for example, a circular or substantially circular cylindrical shape, the diameter is preferably, for example, adjusted within the range of greater than or equal to about 1 mm and less than or equal to about 3 mm. On the other hand, when the shape is a prismatic or substantially prismatic shape, the length in the longitudinal direction Z is preferably, for example, greater than or equal to about 1 mm and less than or equal to about 3 mm, and the length in the width direction Y is preferably greater than or equal to about 5 mm and less than or equal to about 12 mm.

Bonding of the first terminal blocks 40*a* to the first metal terminal 30*a* and bonding of the second terminal blocks 40*b* to the second metal terminal 30*b* are preferably performed using solder. Examples of the solder may include a lead-free solder, such as an Sn—Sb-based solder and an Sn—Ag—Cu-based solder. Among others, when an Sn—Sb-based solder is used, the effect of reducing solder splashes resulting from solder remelting at the time of reflowing is obtained for the multilayer ceramic electronic component 10A.

Each of the first terminal blocks 40*a* and the second terminal blocks 40*b* is defined by a base material and a plating film disposed on the surface of the base material.

To improve the heat radiation property, the base material is preferably made of a metal having a high thermal conductivity, and is preferably made of, for example, oxygen-free copper or a Cu-based alloy. Thus, in the present preferred embodiment of the present invention, the heat radiation property of the terminal blocks 40 is further improved, so low thermal resistance connection between each multilayer ceramic electronic component body 12 and the mounting board is further reliably obtained.

To allow solder to be mounted, the plating film disposed on the surface of the base material is preferably made of, for example, any one of Sn, Ag, and Au or an alloy containing one or more of these metals as main ingredients. Among others, the plating layer is more preferably made of, for example, an alloy containing Sn, an alloy containing Sn as a main ingredient, or Au.

When the plating film is made of Sn or an alloy containing Sn as a main ingredient, the thickness of the plating film is preferably, for example, greater than or equal to about 1.0 μm and less than or equal to about 5.0 μm. When the plating film is made of Au, the thickness of the plating film is preferably, for example, greater than or equal to about 0.01 μm and less than or equal to about 0.05 μm.

Figure 12:
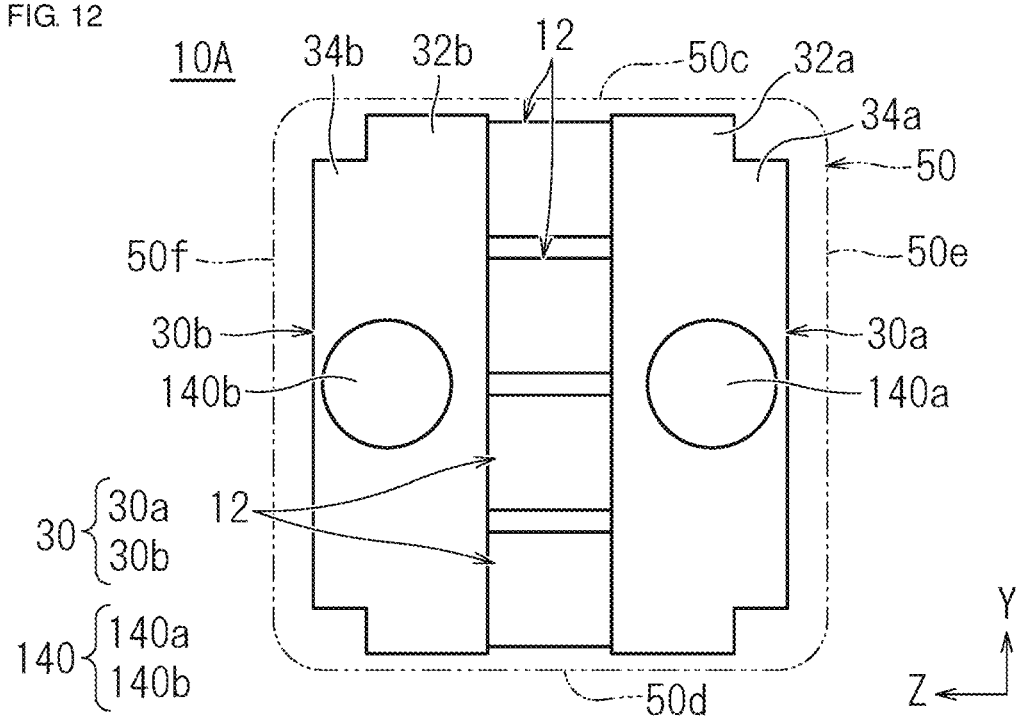
FIG. 12 shows a first alternative arrangement of terminal blocks included in the multilayer ceramic electronic component according to the first preferred embodiment of the present invention.

Next, terminal blocks 140 according to a first alternative preferred embodiment of the terminal blocks 40 will be described. FIG. 12 shows the first alternative preferred embodiment of the terminal blocks included in the multilayer ceramic electronic component according to the first preferred embodiment of the present invention. The terminal blocks 140 include a first terminal block 140*a* and a second terminal block 140*b*.

The single first terminal block 140*a* is provided. The first terminal block 140*a* preferably has, for example, a cylindrical or substantially cylindrical columnar shape.

The first terminal block 140*a* is connected to the first metal terminal 30*a*. As shown in FIG. 12, the first terminal block 140*a* is disposed at the center portion of the first metal terminal 30*a* in the width direction Y, and is disposed astride the first terminal bonding portion 32*a* and the first extended portion 34*a*. Alternatively, the first terminal block 140*a* may be connected to only the first terminal bonding portion 32*a* of the first metal terminal 30*a* or may be connected to only the first extended portion 34*a*.

The single second terminal block 140*b* is provided. The second terminal block 140*b* preferably has, for example, a cylindrical columnar shape or a substantially cylindrical columnar shape.

The second terminal block 140*b* is connected to the second metal terminal 30*b*. As shown in FIG. 12, the second terminal block 140*b* is disposed at the center portion of the second metal terminal 30*b* in the width direction Y, and is disposed astride the second terminal bonding portion 32*b* and the second extended portion 34*b*. Alternatively, the second terminal block 140*b* may be connected to only the second terminal bonding portion 32*b* of the second metal terminal 30*b* or may be connected to only the second extended portion 34*b*.

Figure 13:
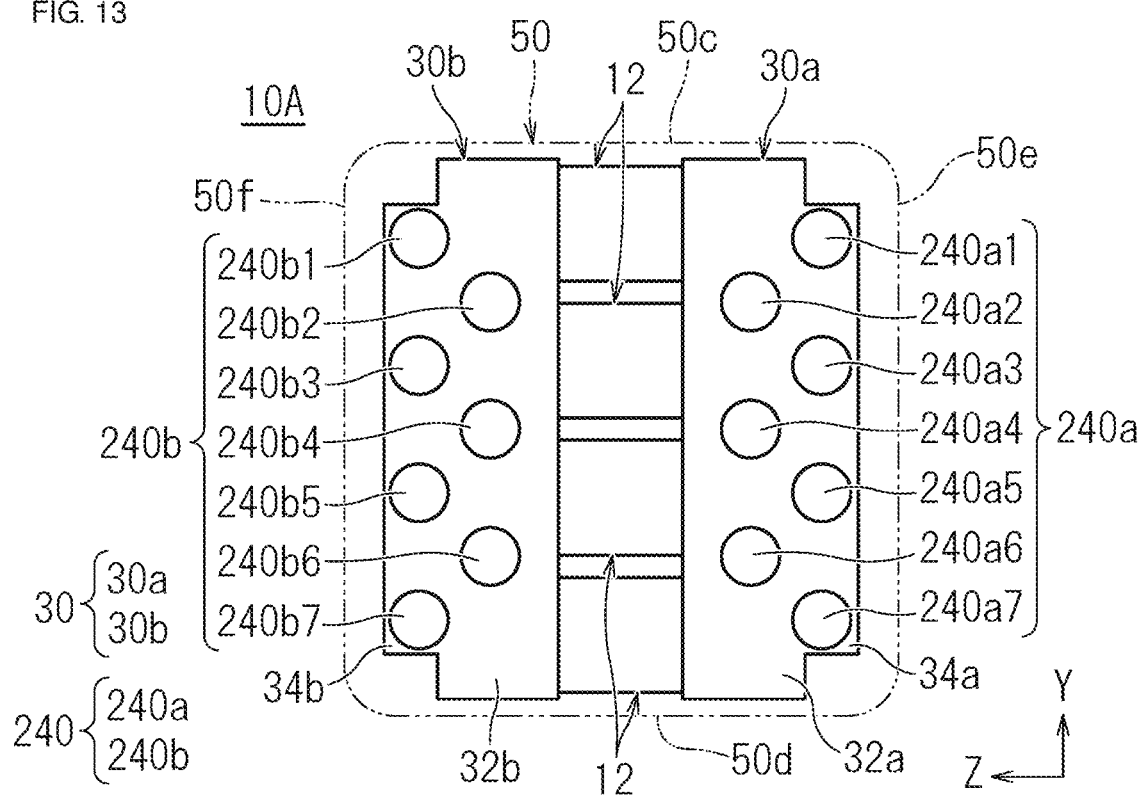
FIG. 13 shows a second alternative arrangement of the terminal blocks included in the multilayer ceramic electronic component according to the first preferred embodiment of the present invention.

Next, terminal blocks 240 according to a second alternative preferred embodiment of the terminal blocks 40 will be described. FIG. 13 shows the second alternative preferred embodiment of the terminal blocks included in the multilayer ceramic electronic component according to the first preferred embodiment of the present invention. The terminal blocks 240 include first terminal blocks 240*a* and second terminal blocks 240*b*.

As shown in FIG. 13, the plurality of first terminal blocks 240*a* are provided in a substantially staggered arrangement. For example, seven first terminal blocks 240*a*1 to 240*a*7 are provided as the first terminal blocks 240*a* of the terminal blocks 240 according to the second alternative preferred embodiment, and each preferably has, for example, a cylindrical or substantially cylindrical columnar shape. Specifically, on the first extended portion 34*a* side of the first metal terminal 30*a*, the first terminal block 240*a*1, the first terminal block 240*a*3, the first terminal block 240*a*5, and the first terminal block 240*a*7 are disposed from the first side surface 50*c* side toward the second side surface 50*d* side. In addition, on the first terminal bonding portion 32*a* side of the first metal terminal 30*a*, the first terminal block 240*a*2, the first terminal block 240*a*4, and the first terminal block 240*a*6 are disposed from the first side surface 50*c* side toward the second side surface 50*d* side.

As shown in FIG. 13, the plurality of second terminal blocks 240*b* are provided in a substantially staggered arrangement. For example, seven second terminal blocks 240*b*1 to 240*b*7 are provided as the second terminal blocks 240*b* of the terminal blocks 240 according to the second alternative preferred embodiment, and each preferably has, for example, a cylindrical or substantially cylindrical columnar shape. Specifically, on the second extended portion 34b side of the second metal terminal 30b, the second terminal block 240b1, the second terminal block 240b3, the second terminal block 240b5, and the second terminal block 240b7 are disposed from the first side surface 50c side toward the second side surface 50d side. In addition, on the second terminal bonding portion 32b side of the second metal terminal 30b, the second terminal block 240b2, the second terminal block 240b4, and the second terminal block 240b6 are disposed from the first side surface 50c side toward the second side surface 50d side.

Figure 14:
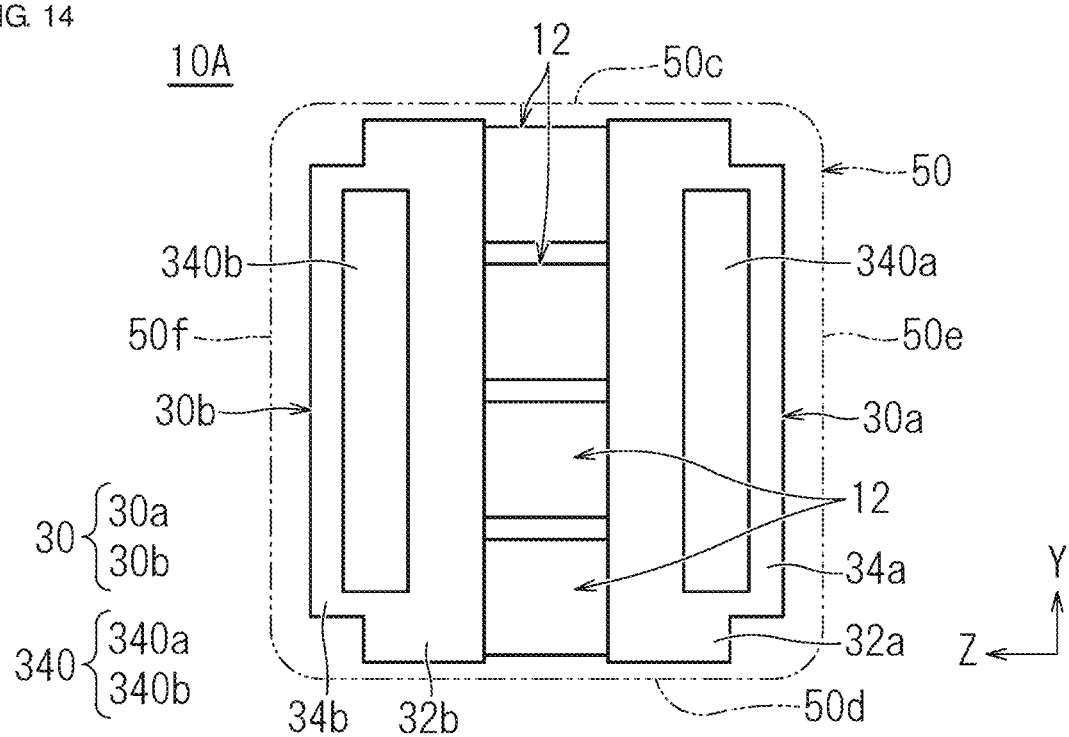
FIG. 14 shows a third alternative arrangement of the terminal blocks included in the multilayer ceramic electronic component according to the first preferred embodiment of the present invention.

Next, terminal blocks 340 according to a third alternative preferred embodiment of the terminal blocks 40 will be described. FIG. 14 shows the third alternative preferred embodiment of the terminal blocks included in the multilayer ceramic electronic component according to the first preferred embodiment of the present invention. The terminal blocks 340 include a first terminal block 340a and a second terminal block 340b.

The single first terminal block 340a is provided. The first terminal block 340a preferably has, for example, a cylindrical or substantially prismatic shape.

The first terminal block 340a is connected to the first metal terminal 30a. As shown in FIG. 14, the first terminal block 340a is disposed on the first metal terminal 30a along the width direction Y, and is disposed astride the first terminal bonding portion 32a and the first extended portion 34a. Alternatively, the first terminal block 340a may be connected to only the first terminal bonding portion 32a of the first metal terminal 30a or may be connected to only the first extended portion 34a.

The single second terminal block 340b is provided. The second terminal block 340b preferably has, for example, a cylindrical or substantially prismatic shape.

The second terminal block 340b is connected to the second metal terminal 30b. As shown in FIG. 14, the second terminal block 340b is disposed on the second metal terminal 30b along the width direction Y, and is disposed astride the second terminal bonding portion 32b and the second extended portion 34b. Alternatively, the second terminal block 340b may be connected to only the second terminal bonding portion 32b of the second metal terminal 30b or may be connected to only the second extended portion 34b.

Figure 15:
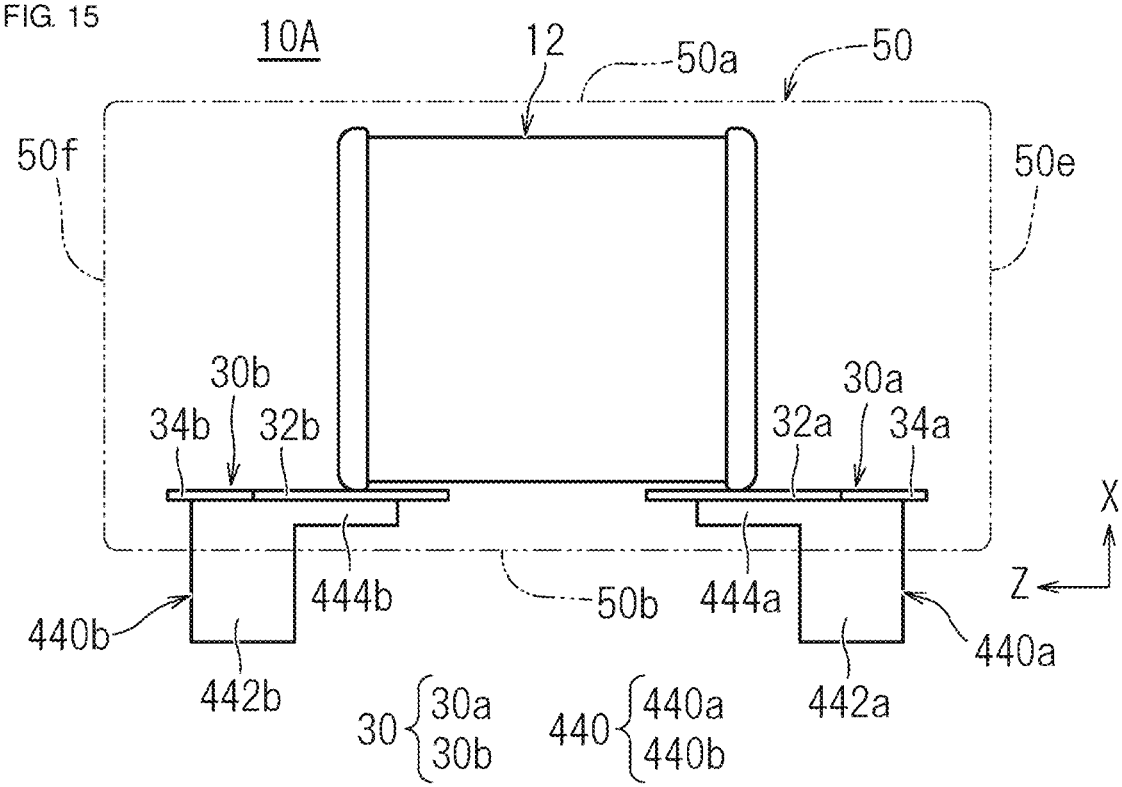
FIG. 15 shows a fourth alternative arrangement of the terminal blocks included in the multilayer ceramic electronic component according to the first preferred embodiment of the present invention.

Next, terminal blocks 440 according to a fourth alternative preferred embodiment of the terminal blocks 40 will be described. FIG. 15 shows the fourth alternative preferred embodiment of the terminal blocks included in the multilayer ceramic electronic component according to the first preferred embodiment of the present invention. The terminal blocks 440 include a first terminal block 440a and a second terminal block 440b.

As shown in FIG. 15, the first terminal block 440a includes a first base portion 442a and a first extended portion 444a. A portion of the first base portion 442a is exposed from the packaging material 50. The first extended portion 444a has a thickness less than the thickness of the first base portion 442a. The first extended portion 444a is connected to the first base portion 442a. The first extended portion 444a is extended toward the multilayer ceramic electronic component bodies 12, and covered with the packaging material 50.

Similarly, the second terminal block 440b includes a second base portion 442b and a second extended portion 444b. Part of the second base portion 442b is exposed from the packaging material 50. The second extended portion 444b has a total thickness less than the thickness of the second base portion 442b. The second extended portion 444b is connected to the second base portion 442b. The second extended portion 444b is extended toward the multilayer ceramic electronic component bodies 12, and covered with the packaging material 50.

Thus, the distance between the first base portion 442a and the second base portion 442b that are partially exposed from the packaging material 50 can be increased to a maximum extent, so a constant creepage distance can be maintained. In addition, the thermal resistance of the heat radiation paths can also be reduced.

When viewed in the height direction X, the area of a portion of the first terminal block 440a, exposed from the packaging material 50, is preferably less than the area of a portion of the first terminal block 440a, connected to the first metal terminal 30a. When viewed in the height direction X, the area of a portion of the second terminal block 440b, exposed from the packaging material 50, is preferably less than the area of a portion of the second terminal block 440b, connected to the second metal terminal 30b.

The shape of each of the first base portion 442a and the second base portion 442b is not specifically limited. The shape may be a cylindrical or substantially cylindrical columnar shape, a prismatic or substantially prismatic shape, or another shape. The shape may be a combination of some of those shapes.

The shape of each of the first extended portion 444a and the second extended portion 444b is also not specifically limited. The shape may be a cylindrical or substantially cylindrical columnar shape, a prismatic or substantially prismatic shape, or another shape. The shape may be a combination of some of those shapes.

The number of the first terminal blocks 440a may be one or may be more than one. Similarly, the number of the second terminal blocks 440b may be one or may be more than one.

When the first terminal block 440a and the second terminal block 440b as shown in FIG. 15 are used, a portion of each of the cylindrical or substantially cylindrical columnar or prismatic or substantially prismatic terminal blocks as shown in the first alternative preferred embodiment to the third alternative preferred embodiment is cut into a shape having an extended portion. Alternatively, base portions and extended portions are prepared and then bonded to each other. The length of the longest portion in the cross-sectional shape of the first base portion 442a at this time is preferably, for example, greater than or equal to about 30 percent and less than or equal to about 60 percent of the length of the longest portion in the longitudinal direction Z in the cross section of the first extended portion 444a of the first terminal block 440a. The length of the longest portion in the cross-sectional shape of the second base portion 442b is preferably, for example, greater than or equal to about 30 percent and less than or equal to about 60 percent of the length of the longest portion in the longitudinal direction Z in the cross section of the second extended portion 444b of the second terminal block 440b. The length of the longest portion in the longitudinal direction Z in the diameter or cross section of each of the first extended portion 444a and the second extended portion 444b is preferably, for example, greater than or equal to about 1 mm and less than or equal to about 2 mm.

Bonding Material

The plurality of first outer electrodes 26a are connected to the first metal terminal 30a by a bonding material. The plurality of second outer electrodes 26b are connected to the second metal terminal 30b by a bonding material.

The bonding material is preferably a solder. Particularly, the bonding material is preferably, for example, a Pb-free solder having a high melting point. Thus, while the bonding strength between each multilayer ceramic electronic component body 12 and each metal terminal 30 is ensured, the heat resistance of each bonding portion against a flow or reflow temperature at the time of mounting the multilayer ceramic electronic component on a board is ensured.

The high-melting-point Pb-free solder is preferably, for example, a Pb-free solder, such as an Sn—Sb-based solder, an Sn—Ag—Cu-based solder, an Sn—Cu-based solder, and an Sn—Bi-based solder. Among others, the high-melting-point Pb-free solder is preferably, for example, an Sn-10Sb to Sn-15Sb solder. Thus, the heat resistance of each bonding portion at the time of mounting is ensured.

Packaging Material

The packaging material 50 is disposed so as to cover the plurality of multilayer ceramic electronic component bodies 12, the first metal terminal 30a, the second metal terminal 30b, a portion of each of the first terminal blocks 40a, and a portion of each of the second terminal blocks 40b. Thus, portions between the terminals are covered with an electrical insulator, so a stable creepage distance is provided. In addition, the exposed first terminal blocks 40a and the exposed second terminal blocks 40b can be used as mounting terminals onto a mounting board. At this time, the packaging material 50 is disposed so as to fill any gap between the plurality of multilayer ceramic electronic component bodies 12.

The shape of the packaging material 50 is not specifically limited. The packaging material 50 preferably has a rectangular or substantially rectangular parallelepiped shape. Alternatively the packaging material 50 may have a trapezoidal or substantially trapezoidal shape. The shape of each of the corners of the packaging material 50 is not specifically limited, and may be rounded.

The first main surface 50a and second main surface 50b of the packaging material 50 preferably have a planar or substantially planar shape. Thus, sufficient flatness is ensured, so poor vacuum holding of the multilayer ceramic electronic component 10A with a mounter of a mounting machine that is used at the time of mounting the multilayer ceramic electronic component 10A on a mounting board is prevented, with the result that the multilayer ceramic electronic component 10A can be reliably mounted on a mounting board. As a result, occurrence of a mounting error can be prevented.

The packaging material 50 is preferably, for example, formed by applying a resin, such as liquid or powder silicone resin and epoxy resin. Alternatively, the packaging material 50 may be molded from an engineering plastic by injection molding, transfer molding, or another molding method. Particularly, the material of the packaging material 50 is preferably made of a thermosetting silicone resin or epoxy resin. Thus, close contact between the packaging material 50 and each multilayer ceramic electronic component body 12 or each metal terminal 30 is ensured, so the effect of improving withstand voltage and moisture resistant performance is obtained. In addition, any gap between the terminals is covered with an electrical insulator, so a stable creepage distance is provided.

Multilayer Ceramic Electronic Component

The multilayer ceramic electronic component 10A according to the first preferred embodiment will be described.

The dimension, in the longitudinal direction Z, of the multilayer ceramic electronic component 10A including the plurality of multilayer ceramic electronic component bodies 12, the packaging material 50, the first metal terminal 30a, and the second metal terminal 30b is defined as L dimension. In other words, the length of the multilayer ceramic electronic component 10A in the longitudinal direction Z that is a direction connecting both end surfaces of each multilayer ceramic electronic component body 12 is defined as L dimension. The L dimension is preferably, for example, greater than or equal to about 10.0 mm and less than or equal to about 20.0 mm.

The dimension, in the width direction Y, of the multilayer ceramic electronic component 10A including the plurality of multilayer ceramic electronic component bodies 12, the packaging material 50, the first metal terminal 30a, and the second metal terminal 30b is defined as Width dimension. In other words, the length of the multilayer ceramic electronic component 10A in the width direction Y that is a direction connecting both main surfaces of each multilayer ceramic electronic component body 12 is defined as Width dimension. The Width dimension is preferably, for example, greater than or equal to about 12.0 mm and less than or equal to about 20.0 mm.

The dimension, in the height direction X, of the multilayer ceramic electronic component 10A including the plurality of multilayer ceramic electronic component bodies 12, the packaging material 50, the first terminal blocks 40a, and the second terminal blocks 40b is defined as Thickness dimension. In other words, the length of the multilayer ceramic electronic component 10A in the height direction X that is a direction connecting both side surfaces of each multilayer ceramic electronic component body 12 is defined as Thickness dimension. The Thickness dimension is preferably, for example, greater than or equal to about 6.0 mm and less than or equal to about 12.0 mm.

In the multilayer ceramic electronic component 10A, the plurality of internal multilayer ceramic electronic component bodies 12 are disposed with a clearance between any adjacent multilayer ceramic electronic component bodies 12. The dimension D3 of the clearance between any adjacent components is preferably, for example, greater than or equal to about 0.2 mm and less than or equal to about 0.6 mm. Thus, a heat insulation property is ensured by the resin in each clearance, so the effect of reducing heat generation is obtained.

The height (projected length: D4), in the height direction X, of each of the first terminal blocks 40a and the second terminal blocks 40b projected from a mounting surface-side bottom face (second main surface 50b) is preferably, for example, greater than or equal to about 0.5 mm and less than or equal to about 2.0 mm. Thus, a certain clearance is provided between the lower face of the multilayer ceramic electronic component 10A and a mounting board, so the multilayer ceramic electronic component 10A is mounted without any influence from unevenness of a board surface. The dimension D4 that is the projected length may be about zero.

In the multilayer ceramic electronic component 10A shown in FIG. 1, since the terminal blocks 40 are connected to the metal terminals 30 to which the multilayer ceramic electronic component bodies 12 are connected, low-thermalresistance connection between each multilayer ceramic electronic component body 12 and a mounting board is achieved. As a result, the heat radiation property of the multilayer ceramic electronic component is improved.

In the multilayer ceramic electronic component 10A shown in FIG. 1, when the metal terminals 30 are preferably made of, for example, a metal having a coefficient of linear expansion less than or equal to about $12 \times 10^{-6}$, thermal stress that is generated as a result of the difference in coefficient of linear expansion between each multilayer ceramic electronic component body 12 and each metal terminal 30 is reduced, so cracks caused by the heat cycle of the multilayer ceramic electronic component are also reduced. Thus, not only improvement in the heat radiation property of the multilayer ceramic electronic component but also crack reduction of the multilayer ceramic electronic component bodies 12 is achieved.

In the multilayer ceramic electronic component 10A shown in FIG. 1, the thickness dimension of each multilayer ceramic electronic component body 12 in the height direction x connecting the first main surface 14a and the second main surface 14b is less than the width dimension of the multilayer ceramic electronic component body 12 in the width direction y connecting the first side surface 14c and the second side surface 14d, and each multilayer ceramic electronic component body 12 is disposed such that the first side surface 14c or the second side surface 14d faces a mounting surface. That is, each multilayer ceramic electronic component body 12 is disposed such that facing planes of the internal electrode layers 18 and a mounting surface are perpendicular to each other, and is disposed such that the first side surface 14c or second side surface 14d having a small area faces the mounting surface. In this way, since each multilayer ceramic electronic component body is disposed such that the face having a small area is faced toward a mounting surface, a mounting area can be reduced, so miniaturization is achieved.

Second Preferred Embodiment

Figure 16:
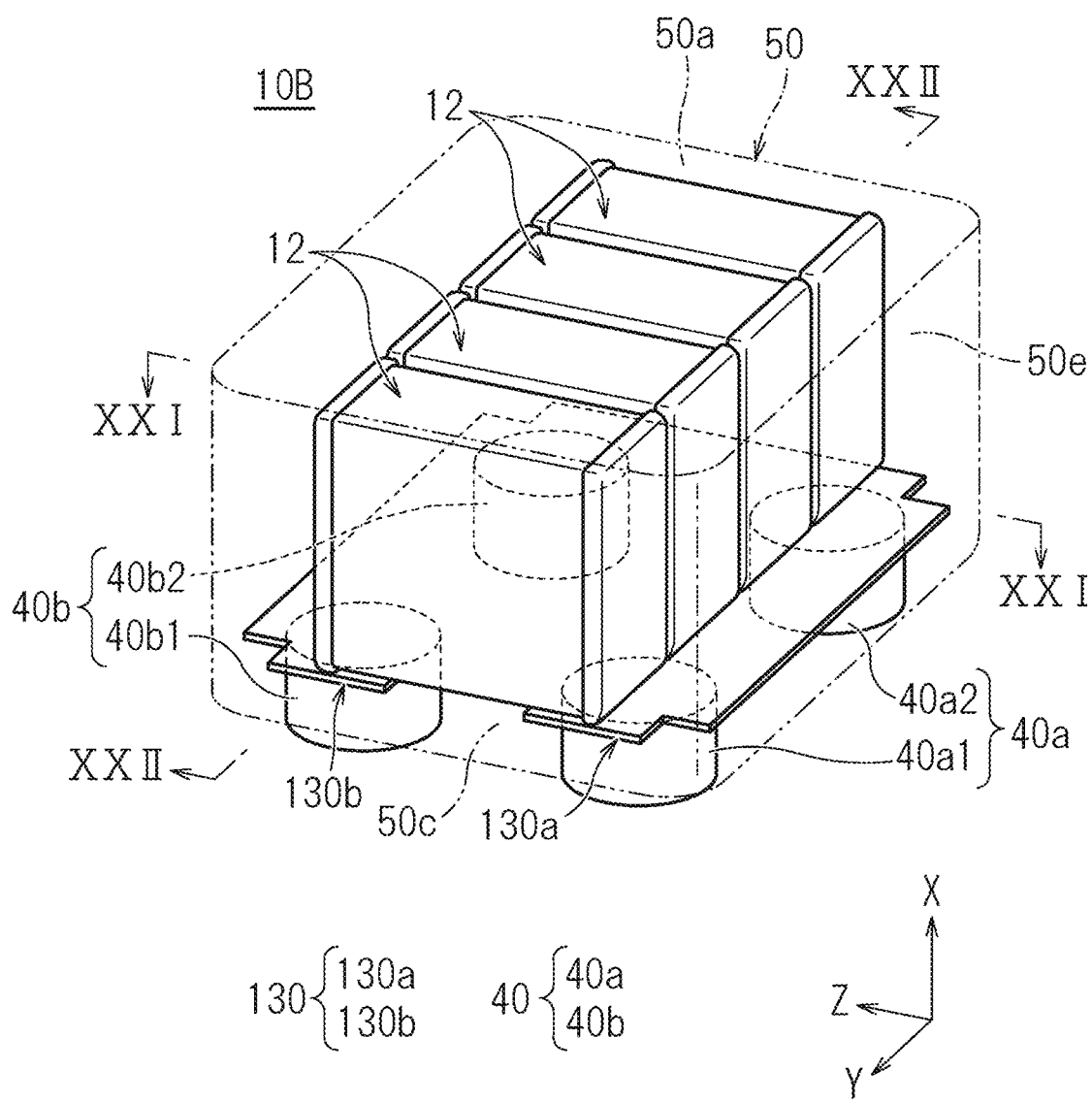
FIG. 16 is an external perspective view showing one example of a multilayer ceramic electronic component according to a second preferred embodiment of the present invention.
Figure 17:
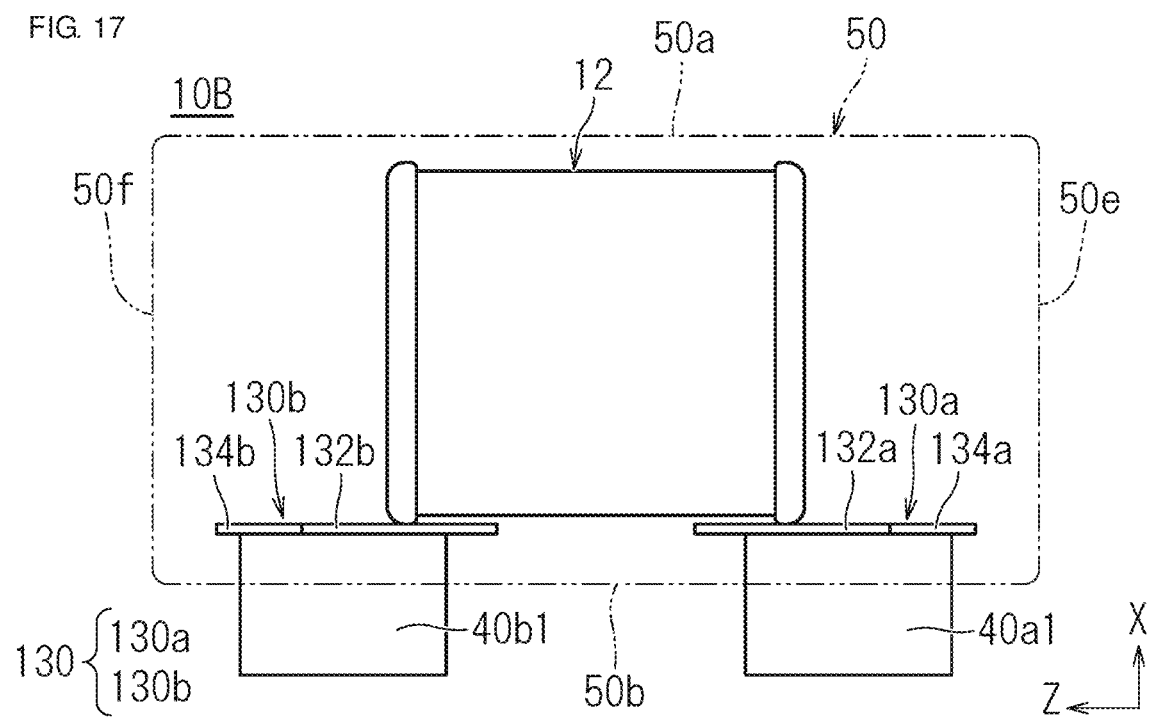
FIG. 17 is a front view of the multilayer ceramic electronic component shown in FIG. 16 showing the multilayer ceramic electronic component according to the second preferred embodiment of the present invention.
Figure 18:
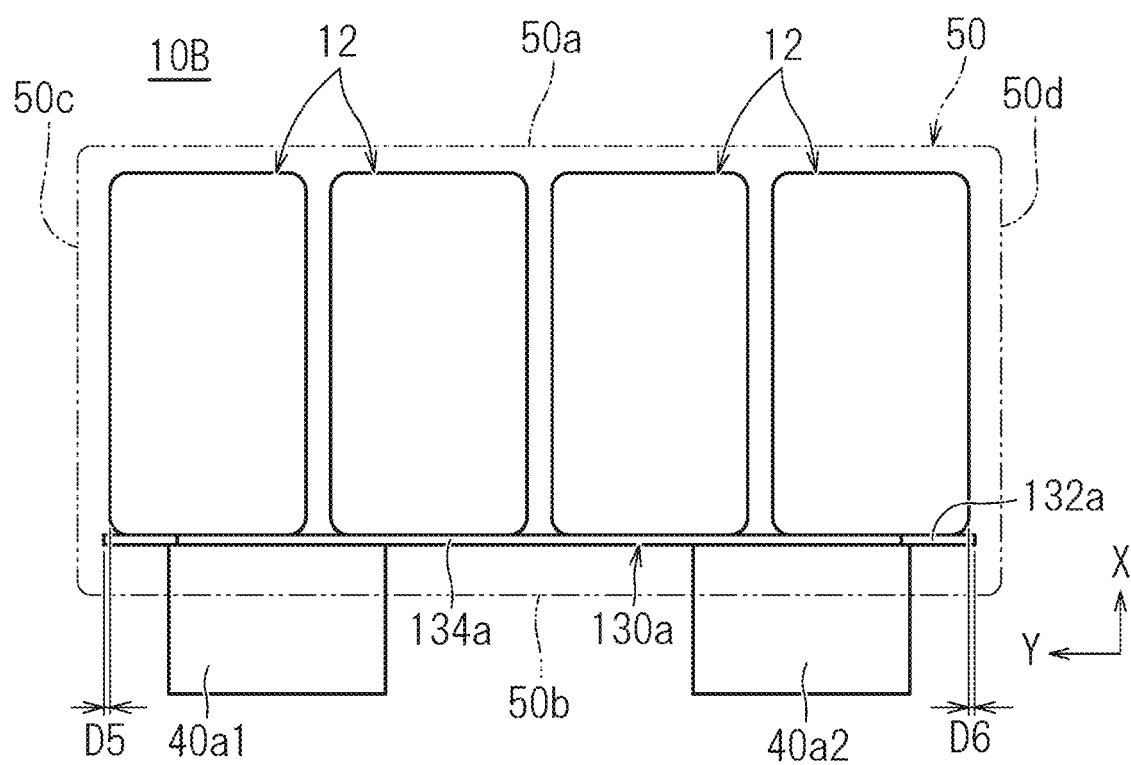
FIG. 18 is a side view of the multilayer ceramic electronic component shown in FIG. 16 showing the multilayer ceramic electronic component according to the second preferred embodiment of the present invention.
Figure 19:
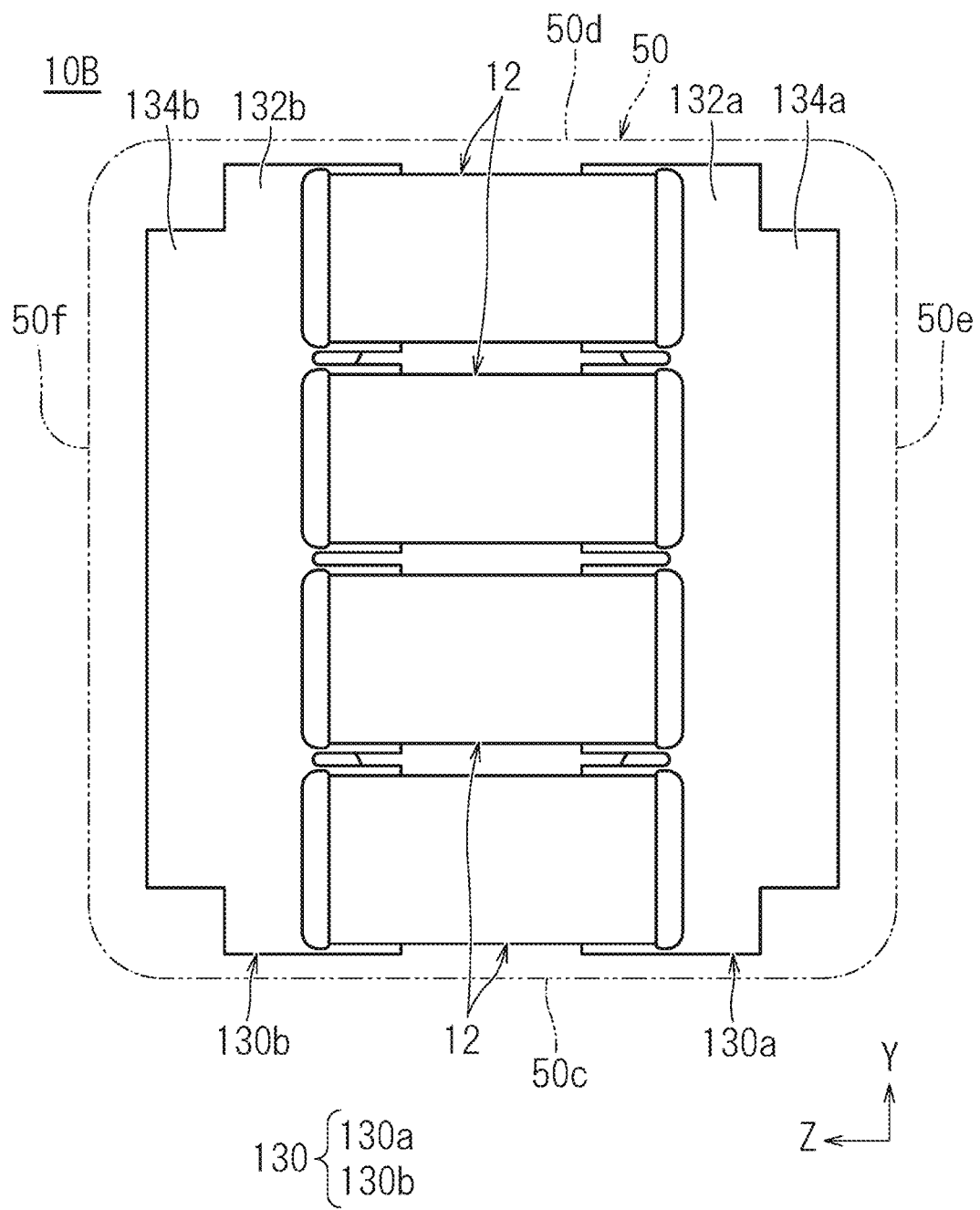
FIG. 19 is a top view of the multilayer ceramic electronic component shown in FIG. 16 showing the multilayer ceramic electronic component according to the second preferred embodiment of the present invention.
Figure 20:
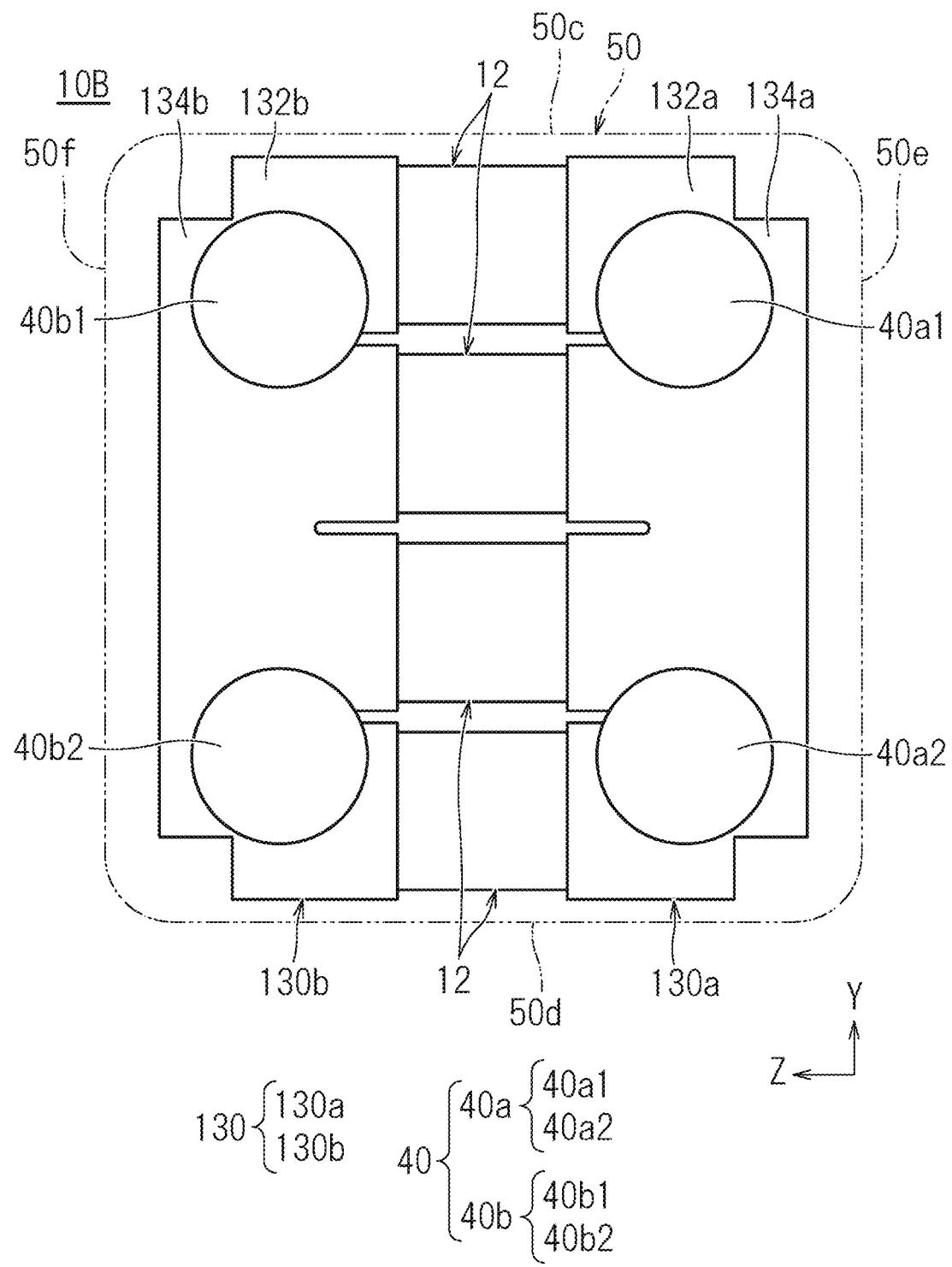
FIG. 20 is a bottom view of the multilayer ceramic electronic component shown in FIG. 16 showing the multilayer ceramic electronic component according to the second preferred embodiment of the present invention.
Figure 21:
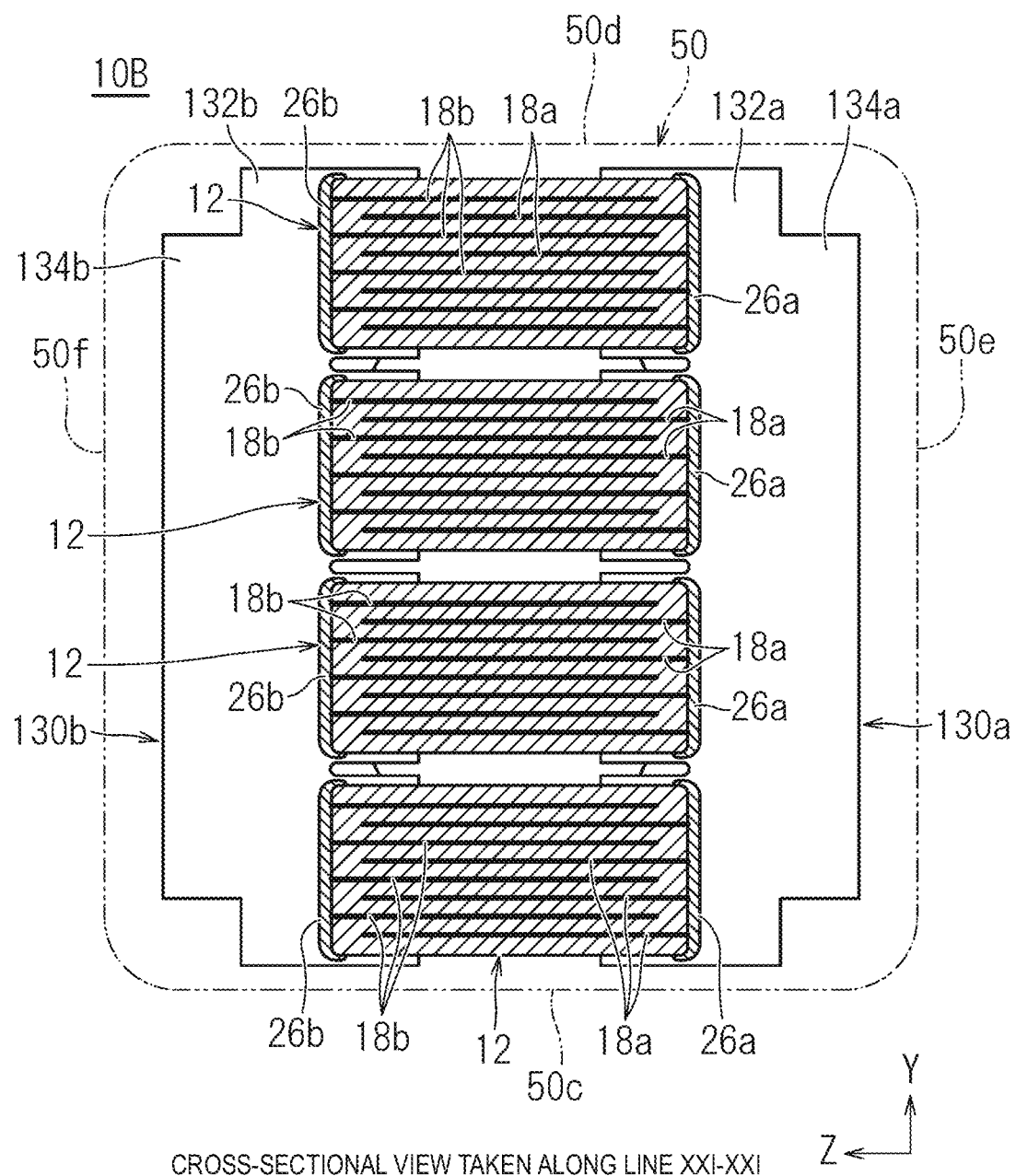
FIG. 21 is a cross-sectional view of the multilayer ceramic electronic component, taken along the line XXI-XXI in FIG. 16.
Figure 22:
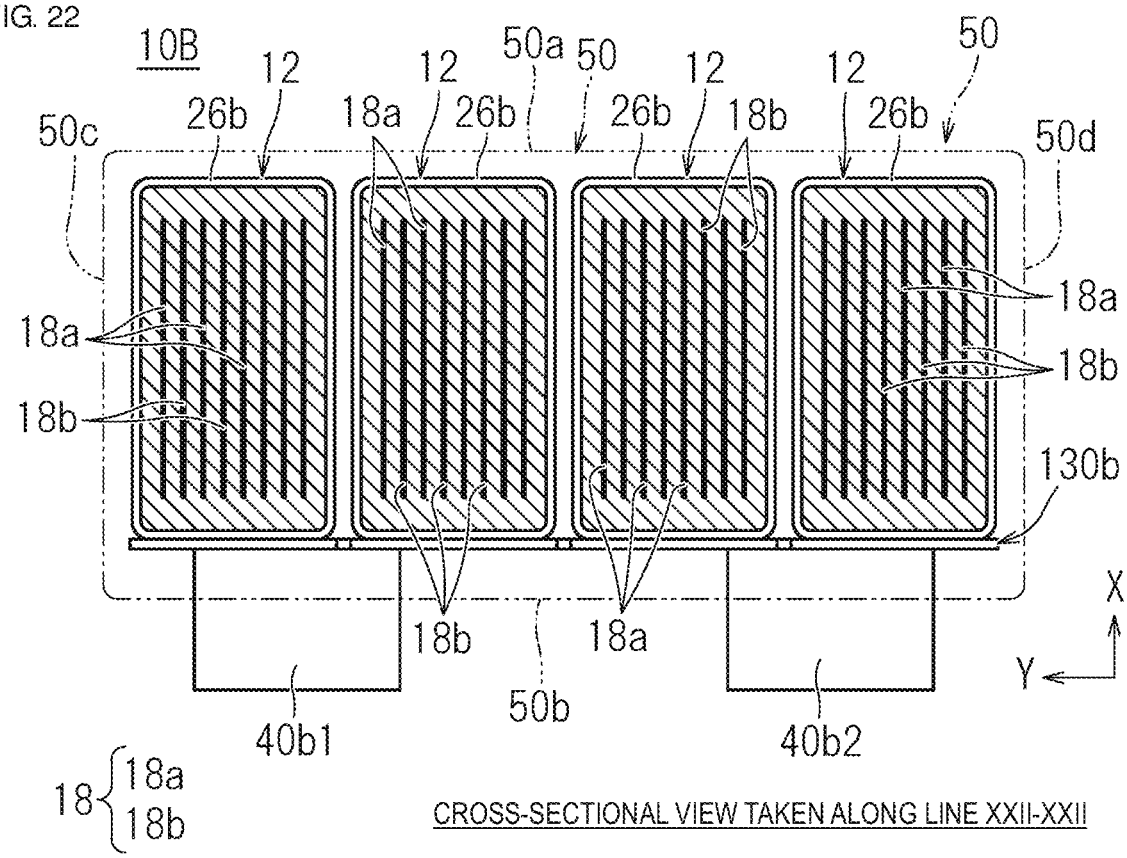
FIG. 22 is a cross-sectional view of the multilayer ceramic electronic component, taken along the line XXII-XXII in FIG. 16.
Figure 23:
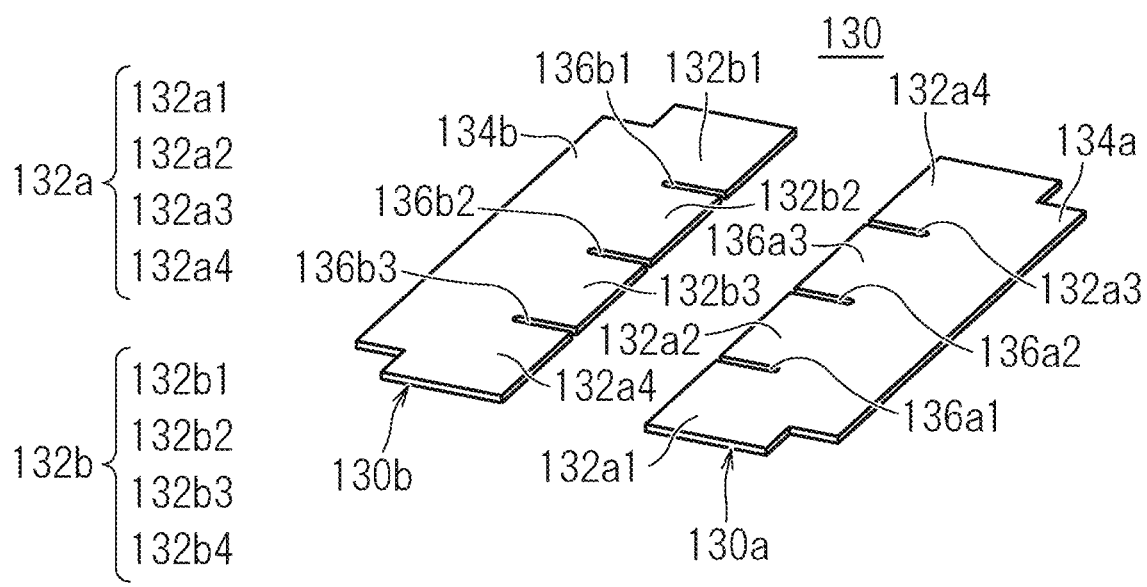
FIG. 23 is an external perspective view showing metal terminals included in the multilayer ceramic electronic component according to the second preferred embodiment of the present invention.

A multilayer ceramic electronic component according to a second preferred embodiment of the present invention will be described. FIG. 16 is an external perspective view showing one example of the multilayer ceramic electronic component according to the second preferred embodiment of the present invention. FIG. 17 is a front view of the multilayer ceramic electronic component shown in FIG. 16 showing the multilayer ceramic electronic component according to the second preferred embodiment of the present invention. FIG. 18 is a side view of the multilayer ceramic electronic component shown in FIG. 16 showing the multilayer ceramic electronic component according to the second preferred embodiment of the present invention. FIG. 19 is a top view of the multilayer ceramic electronic component shown in FIG. 16 showing the multilayer ceramic electronic component according to the second preferred embodiment of the present invention. FIG. 20 is a bottom view of the multilayer ceramic electronic component shown in FIG. 16 showing the multilayer ceramic electronic component according to the second preferred embodiment of the present invention. FIG. 21 is a cross-sectional view of the multilayer ceramic electronic component, taken along the line XXI-XXI in FIG. 16. FIG. 22 is a cross-sectional view of the multilayer ceramic electronic component, taken along the line XXII-XXII in FIG. 16. FIG. 23 is an external perspective view showing metal terminals included in the multilayer ceramic electronic component according to the second preferred embodiment of the present invention.

The multilayer ceramic electronic component 10B according to the present preferred embodiment has a similar configuration to that of the multilayer ceramic electronic component 10A described with reference to FIG. 1 except that the configuration of a pair of metal terminals 130 is preferably different from the configuration of the pair of metal terminals 30. Therefore, the same reference signs denote the same or similar portions as those of the multilayer ceramic electronic component 10A shown in FIG. 1, and the description thereof is omitted.

The multilayer ceramic electronic component 10B includes the plurality of multilayer ceramic electronic component bodies 12. The multilayer ceramic electronic component 10B includes the metal terminals 130, the terminal blocks 40, and the packaging material 50. The metal terminals 130 are connected to the outer electrodes 26 of the multilayer ceramic electronic component bodies 12. The terminal blocks 40 are connected to the metal terminals 130. The packaging material 50 covers the laminate 14, the outer electrodes 26, the metal terminals 130, and part of each of the terminal blocks 40.

The packaging material 50 includes the first main surface 50a, the second main surface 50b, the first side surface 50c, the second side surface 50d, the first end surface 50e, and the second end surface 50f. The first main surface 50a and the second main surface 50b face the first side surfaces 14c and second side surfaces 14d of the multilayer ceramic electronic component bodies 12. The first side surface 50c and the second side surface 50d face the first main surfaces 14a and second main surfaces 14b of the multilayer ceramic electronic component bodies 12. The first end surface 50e and the second end surface 50f face the first end surfaces 14e and second end surfaces 14f of the multilayer ceramic electronic component bodies 12.

The metal terminals 130 that are used for the multilayer ceramic electronic component 10B shown in FIG. 16 include a first metal terminal 130a and a second metal terminal 130b.

The first metal terminal 130a is connected to the first outer electrodes 26a of the plurality of multilayer ceramic electronic component bodies 12 by a bonding material. Specifically, the first metal terminal 130a is connected to the first outer electrode 26a located on the first side surface 14c or second side surface 14d of each of the multilayer ceramic electronic component bodies 12.

The second metal terminal 130b is connected to the second outer electrodes 26b of the plurality of multilayer ceramic electronic component bodies 12 by a bonding material. Specifically, the second metal terminal 130b is connected to the second outer electrode 26b located on the first side surface 14c or second side surface 14d of each of the multilayer ceramic electronic component bodies 12.

The first metal terminal 130a includes a first terminal bonding portion 132a and a first extended portion 134a. The first terminal bonding portion 132a is connected to the first outer electrodes 26a, and faces the first side surfaces 14c or second side surfaces 14d of the multilayer ceramic electronic component bodies 12. The first extended portion 134a is connected to the first terminal bonding portion 132a, and extends in a direction parallel or substantially parallel to the first side surfaces 14c or second side surfaces 14d of the multilayer ceramic electronic component bodies 12 away from the plurality of multilayer ceramic electronic component bodies 12. The first extended portion 134a may linearly extend or may have a shape curved or bent at multiple portions.

The second metal terminal 130b includes a second terminal bonding portion 132b and a second extended portion 134b. The second terminal bonding portion 132b is connected to the second outer electrodes 26b, and faces the first side surfaces 14c or second side surfaces 14d of the multilayer ceramic electronic component bodies 12. The second extended portion 134b is connected to the second terminal bonding portion 132b, and extends in a direction parallel or substantially parallel to the first side surfaces 14c or second side surfaces 14d of the multilayer ceramic electronic component bodies 12 away from the plurality of multilayer ceramic electronic component bodies 12. The second extended portion 134b may linearly extend or may have a shape curved or bent at multiple portions, for example.

As shown in FIG. 23, the first terminal bonding portion 132a of the first metal terminal 130a that is used for the multilayer ceramic electronic component 10B shown in FIG. 16 differs from the first terminal bonding portion 32a of the first metal terminal 30a in that a plurality of first cutout portions 136a1 to 136a3 each are provided so as to be located between any adjacent two of the plurality of multilayer ceramic electronic component bodies 12. The first terminal bonding portion 132a is divided into a plurality of first bonding pieces 132a1 to 132a4 by the plurality of first cutout portions 136a1 to 136a3. Thus, the first bonding pieces 132a1 to 132a4 are respectively provided in association with the first outer electrodes 26a of the multilayer ceramic electronic component bodies 12.

As shown in FIG. 23, the second terminal bonding portion 132b of the second metal terminal 130b differs from the second terminal bonding portion 32b of the second metal terminal 30b in that a plurality of second cutout portions 136b1 to 136b3 each are provided so as to be located between any adjacent two of the plurality of multilayer ceramic electronic component bodies 12. The second terminal bonding portion 132b is divided into a plurality of second bonding pieces 132b1 to 132b4 by the plurality of second cutout portions 136b1 to 136b3. Thus, the second bonding pieces 132b1 to 132b4 are provided in association with the second outer electrodes 26b of the multilayer ceramic electronic component bodies 12.

As shown in FIG. 23, when the first bonding pieces 132a1 to 132a4 are respectively provided for the first outer electrodes 26a of the multilayer ceramic electronic component bodies 12 independently of one another, the first bonding pieces 132a1 to 132a4 are provided independently of one another such that the length of each of the first bonding pieces 132a1 to 132a4 of the first terminal bonding portion 132a of the first metal terminal 130a in the width direction Y of the multilayer ceramic electronic component 10B matches the length, in the height direction x, of each of the first outer electrodes 26a respectively located on the first side surfaces (mounting surface-side side surfaces) of the plurality of multilayer ceramic electronic component bodies 12.

At this time, one end of the first terminal bonding portion 132a of the first metal terminal 130a, located near the first side surface 50c of the multilayer ceramic electronic component 10B, is preferably provided so as to project by, for example, a dimension D5 of greater than or equal to about 0.05 mm and less than or equal to about 0.25 mm from the left end of the first outer electrode 26a located on the first side surface 14c or second side surface 14d (mounting surface-side side surface) of the multilayer ceramic electronic component body 12 closest to the first side surface 50c of the multilayer ceramic electronic component 10B.

Similarly, the other end of the first terminal bonding portion 132a of the first metal terminal 130a, located near the second side surface 50d of the multilayer ceramic electronic component 10B, is preferably provided so as to project by, for example, a dimension D6 of greater than or equal to about 0.05 mm and less than or equal to about 0.25 mm from the right end of the first outer electrode 26a located on the first side surface 14c or second side surface 14d (mounting surface-side side surface) of the multilayer ceramic electronic component body 12 closest to the second side surface 50d of the multilayer ceramic electronic component 10B.

Furthermore, the relationship between the second terminal bonding portion 132b of the second metal terminal 130b and each second outer electrode 26b is also preferably similar.

Thus, the bonding area between each multilayer ceramic electronic component body 12 and each metal terminal 130 is kept constant, so bonding strength and the resistance value of each metal terminal 130 can be regulated within a set range. The clearance between any adjacent two of the plurality of multilayer ceramic electronic component bodies 12 is adjusted for the projected width.

The terminal blocks 40 include the first terminal block 40a and the second terminal block 40b.

One or plurality of the first terminal blocks 40a are provided. When the plurality of second terminal blocks 40a are provided, the number of heat radiation paths is increased, so the heat radiation property of the terminal blocks 40 is further improved. In the multilayer ceramic electronic component 10B according to the present preferred embodiment, two terminal blocks, that is, the first terminal block 40a1 and the first terminal block 40a2, are provided, and each preferably have, for example, a cylindrical or substantially cylindrical columnar shape.

Similarly, one or plurality of the second terminal blocks 40b are provided. When the plurality of second terminal blocks 40b are provided, the number of heat radiation paths is increased, so the heat radiation property of the terminal blocks 40 is further improved. In the multilayer ceramic electronic component 10B according to the present preferred embodiment, two terminal blocks, that is, the second terminal block 40b1 and the second terminal block 40b2, are provided, and each preferably has, for example, a cylindrical or substantially cylindrical columnar shape.

The first terminal block 40a1 and the first terminal block 40a2 are connected to the first metal terminal 130a. The first terminal block 40a1 is disposed astride the first terminal bonding portion 132a and first extended portion 134a of the first metal terminal 130a near the first side surface 50c. The first terminal block 40a2 is disposed astride the first terminal bonding portion 132a and first extended portion 134a of the first metal terminal 130a near the second side surface 50d. Alternatively, the first terminal block 40a1 and the first terminal block 40a2 may be disposed so as to be connected to only the first terminal bonding portion 132a of the first metal terminal 130a or may be connected to only the first extended portion 134a.

The second terminal block 40b1 and the second terminal block 40b2 are connected to the second metal terminal 130b. The second terminal block 40b1 is disposed astride the second terminal bonding portion 132b and second extended portion 134b of the second metal terminal 130b near the first side surface 50c. The second terminal block 40b2 is disposed astride the second terminal bonding portion 132b and second extended portion 134b of the second metal terminal 130b near the second side surface 50d. Alternatively, the second terminal block 40b1 and the second terminal block 40b2 may be disposed so as to be connected to only the second terminal bonding portion 132b of the second metal terminal 130b or may be connected to only the second extended portion 134b.

The terminal blocks 140, 240, 340, 440 described as the alternative preferred embodiments shown in FIG. 11 to FIG. 14 as the terminal blocks that can be applied to the multilayer ceramic electronic component 10A according to the first preferred embodiment can also be applied to the terminal blocks included in the multilayer ceramic electronic component 10B according to the second preferred embodiment.

The multilayer ceramic electronic component 10B shown in FIG. 16 provides the same or substantially the same advantageous effects as those of the multilayer ceramic electronic component 10A shown in FIG. 1.

2. Manufacturing Method for Multilayer Ceramic Electronic Component

Next, a preferred embodiment of a manufacturing method for the thus configured multilayer ceramic electronic component will be described by taking the multilayer ceramic electronic component 10A as an example. The following description will be made by taking a manufacturing method for a multilayer ceramic capacitor as the multilayer ceramic electronic component body 12 as an example.

Manufacturing Method for Multilayer Ceramic Electronic Component Body

First, ceramic paste containing ceramic powder is applied in a sheet shape or substantially sheet shape by, for example, screen printing, or the like, and is dried, with the result that a ceramic green sheet is prepared.

Subsequently, electrically conductive paste for forming internal electrodes is applied onto the ceramic green sheet in a predetermined pattern by, for example, screen printing, gravure printing, or the like. As a result, the ceramic green sheet on which an electrically conductive pattern for forming internal electrodes is formed and a ceramic green sheet on which no electrically conductive pattern for forming internal electrodes is formed are prepared. The ceramic paste and the electrically conductive paste for forming internal electrodes may contain, for example, a known binder or solvent.

Subsequently, a predetermined number of ceramic green sheets for an outer layer, on which no electrically conductive pattern for forming internal electrodes is formed, are laminated, the ceramic green sheets on which the electrically conductive pattern for internal electrodes is formed are sequentially laminated on the ceramic green sheets for the outer layer, and, furthermore, a predetermined number of ceramic green sheets on which no electrically conductive pattern for forming internal electrodes is formed are further laminated. Thus, a mother laminate is prepared. At this time, the ceramic green sheets on which the electrically conductive pattern for forming internal electrodes is printed are laminated such that the extended portions of electrically conductive patterns for forming internal electrodes are in a staggered arrangement. Where necessary, the mother laminate may be pressure-bonded in the lamination direction (height direction) with an isostatic press, or other devices.

After that, the mother laminate is cut into a predetermined geometry. Thus, a raw multilayer chip is obtained. At this time, the corners and edges of the laminate may be rounded by, for example, barreling the raw multilayer chip.

Subsequently, the cut raw multilayer chip is fired. As a result, the first internal electrode layers and the second internal electrode layers are disposed in the laminate, and the first internal electrode layers are extended to the first end surface and the second internal electrode layers are extended to the second end surface is produced. Although the firing temperature of the raw multilayer chip depends on the material of the ceramics and the material of the electrically conductive paste for forming internal electrodes, the firing temperature is preferably, for example, higher than or equal to about 900 degrees C. and lower than or equal to about 1300 degrees C.

Next, the base electrode layers are formed. When each base electrode layer is a baked layer, first, electrically conductive paste for outer electrodes is applied to both end surfaces of the fired multilayer chip, and baked. Thus, the first base electrode layer of the first outer electrode 26a and the second base electrode layer of the second outer electrode 26b are formed. The baking temperature is preferably, for example, higher than or equal to about 700 degrees C. and lower than or equal to about 900 degrees C. At the time of applying electrically conductive paste for outer electrodes, an end surface electrode (without folded outer electrodes) structure having a substantially saddle shape at the outer peripheral portion is provided as a result of film formation by screen printing. At this time, the height of the saddle can be controlled by adjusting the viscosity or amount of electrically conductive paste for outer electrodes.

After that, where necessary, a plating layer is formed on the surface of each base electrode layer. Thus, each outer electrode 26 is formed. In the multilayer ceramic electronic component body 12 shown in FIG. 2, an Ni-plating layer and an Sn-plating layer are formed as the plating layer to be formed on each base electrode layer. The Ni-plating layer and the Sn-plating layer are sequentially formed by, for example, electrolytic plating, electroless plating, or the like.

As described above, the multilayer ceramic electronic component body 12 shown in FIG. 2 is manufactured.

Method of Attaching Metal Terminals

Subsequently, the metal terminals 30 are attached to the plurality of multilayer ceramic electronic component bodies 12.

First, the first metal terminal 30a and the second metal terminal 30b are prepared.

Then, the metal terminals 30 are attached to the outer electrodes 26 of the plurality of multilayer ceramic electronic component bodies 12 by a bonding material. Solder is used as the bonding material. In reflowing, a soldering temperature of, for example, higher than or equal to about 270 degrees C. and lower than or equal to about 290 degrees C. is applied for about 30 seconds or longer.

Method of Attaching Terminal Blocks

Subsequently, the first terminal blocks 40a are attached to the first metal terminal 30a, and the second terminal blocks 40b are attached to the second metal terminal 30b. Solder is used as a bonding material for attaching the terminal blocks 40 to the metal terminals 30.

First, solder is applied to a face of the first metal terminal 30a, on which no multilayer ceramic electronic component body 12 is connected, and is also applied to a face of the second metal terminal 30b, on which no multilayer ceramic electronic component body 12 is connected. Then, the first metal terminal 30a and the first terminal blocks 40a are connected by reflowing, and the second metal terminal 30b and the second terminal blocks 40b are connected by reflowing.

Method of Forming Packaging Material

Subsequently, the packaging material 50 of the multilayer ceramic electronic component 10A is formed. The packaging material 50 is formed by, for example, transfer molding. Specifically, a die is filled with resin for the packaging material 50, a multilayer ceramic electronic component before the packaging material 50 is formed is disposed in the resin, and then the resin is cured. Thus, the packaging material is formed on the multilayer ceramic electronic component bodies 12, the first metal terminal 30a, the second metal terminal 30b, a portion of each of the first terminal blocks 40a, and a portion of each of the second terminal blocks 40b.

As described above, the multilayer ceramic electronic component 10A shown in FIG. 1 is manufactured.

3. Experimental Examples

Next, the multilayer ceramic electronic components 10A according to Examples were manufactured in accordance with the above-described manufacturing method, and heat radiation properties were checked through heating test, and also the multilayer ceramic electronic components subjected to heat cycle test were checked for cracks. A multilayer ceramic electronic component with metal terminals was prepared as Comparative Example 1. A film capacitor was prepared as Comparative Example 2. The multilayer ceramic electronic component with metal terminals and the film capacitor were subjected to similar tests. Because a multilayer ceramic capacitor significantly fluctuates in electrostatic capacitance at the time when applied with voltage, the dimensions were compared by using products of which the electrostatic capacities were matched with one another at the time when applied with 50 percent of the rated voltage.

Example 1 to Example 3 were prepared as Examples. The base materials of the metal terminals of Examples were different from one another. Hereinafter, the details of Example 1 to Example 3 will be described.

To manufacture samples for Example 1, the multilayer ceramic electronic component 10A having the following specifications was manufactured in accordance with the above-described manufacturing method for a multilayer ceramic electronic component.

Dimensions L×W×T (design values) of each multilayer ceramic electronic component: about 14 mm×about 14 mm×about 8 mm
Capacitance: about 612 nF
Rated voltage: about 1250 V
Number of multilayer ceramic electronic component bodies: 4
Connection structure: parallel connection
Metal terminals
Base material: SUS430
Average coefficient of linear expansion at—about 55 degrees C. to about 200 degrees C. by measuring method of JIS Z 2285:2003: about $12 \times 10^{-6}$
Plating film: two-layer structure of Ni-plating layer and Sn-plating layer
Terminal blocks
Base material: oxygen-free copper
Plating layers: two-layer structure of Ni-plating layer and Sn-plating layer
Diameter: about 3 mm
Height: about 3 mm
Bonding material
Bonding material between each outer electrode and each metal terminal: Sn-10Sb solder
Bonding material between each metal terminal and each terminal block: Sn-10Sb solder
Packaging material: epoxy resin
The specifications of the multilayer ceramic capacitor that is each of the multilayer ceramic electronic component bodies included in the multilayer ceramic electronic component according to Example 1 are as follows:
Dimensions l×w×t (design values) of each multilayer ceramic electronic component body: about 5.7 mm×about 5.0 mm×about 2.7 mm
Material of ceramic layers: $BaTiO_3$
Capacitance: about 153 nF
Rated voltage: about 1250 V
Material of internal electrode layers: Ni
Outer electrodes
Base electrode layers: base electrode layer containing Cu and glass
Thickness at ½ location along the longitudinal direction l on the side surface or main surface: about 47 μm
Thickness at ½ location along the height direction t on the end surface: about 86 μm
Plating layer: two-layer structure of Ni-plating layer and Sn-plating layer
Thickness of the Ni-plating layer at ½ location along the longitudinal direction l on the side surface or main surface: about 3 μm
Thickness of the Ni-plating layer at ½ location along the height direction t on the end surface: about 3 μm
Thickness of the Sn-plating layer at ½ location along the longitudinal direction l on the side surface or main surface: about 4 μm
Thickness of the Sn-plating layer at ½ location along the height direction t on the end surface: about 4 μm
To manufacture samples for Example 2, the multilayer ceramic electronic component 10A having the following specifications was manufactured in accordance with the above-described manufacturing method for a multilayer ceramic electronic component.
Dimensions L×W×T (design values) of each multilayer ceramic electronic component: about 14 mm×about 14 mm×about 8 mm
Capacitance: about 612 nF
Rated voltage: about 1250 V
Number of multilayer ceramic electronic component bodies: 4
Connection structure: parallel connection
Metal terminals
Base material: 42 alloy
Average coefficient of linear expansion at −55 degrees C. to 200 degrees C. by measuring method of JIS Z 2285:2003: about $4.5 \times 10^{-6}$
Plating film: two-layer structure of Ni-plating layer and Sn-plating layer
Terminal blocks
Base material: oxygen-free copper
Plating layer: two-layer structure of Ni-plating layer and Sn-plating layer
Diameter: about 3 mm Height: about 3 mm
Bonding material
Bonding material between each outer electrode and each metal terminal: Sn-10Sb solder
Bonding material between each metal terminal and each terminal block: Sn-10Sb solder
Packaging material: epoxy resin The specifications of the multilayer ceramic capacitor that is each of the multilayer ceramic electronic component bodies included in the multilayer ceramic electronic component according to Example 2 are as follows:
Dimensions l×w×t (design values) of each multilayer ceramic electronic component body: about 5.7 mm×about 5.0 mm×about 2.7 mm
Material of ceramic layers: BaTiO$_3$
Capacitance: about 153 nF
Rated voltage: about 1250 V
Material of internal electrode layers: Ni
Outer electrodes
Base electrode layers: base electrode layer containing Cu and glass
Thickness at ½ location along the longitudinal direction l on the side surface or main surface: about 45 μm
Thickness at ½ location along the height direction t on the end surface: about 83 μm
Plating layer: two-layer structure of Ni-plating layer and Sn-plating layer
Thickness of the Ni-plating layer at ½ location along the longitudinal direction l on the side surface or main surface: about 3 μm
Thickness of the Ni-plating layer at ½ location along the height direction t on the end surface: about 3 μm
Thickness of the Sn-plating layer at ½ location along the longitudinal direction l on the side surface or main surface: about 4 μm
Thickness of the Sn-plating layer at ½ location along the height direction l on the end surface: 4 μm To manufacture samples for Example 3, the multilayer ceramic electronic component 10A having the following specifications was manufactured in accordance with the above-described manufacturing method for a multilayer ceramic electronic component.
Dimensions L×W×T (design values) of each multilayer ceramic electronic component: about 14 mm×about 14 mm×about 8 mm
Capacitance: about 612 nF
Rated voltage: about 1250 V
Number of multilayer ceramic electronic component bodies: 4
Connection structure: parallel connection
Metal terminals
Base material: phosphor bronze (C5210)
Average coefficient of linear expansion at −55 degrees C. to 200 degrees C. by measuring method of JIS Z 2285:2003: about 18.2×10$^{-6}$
Plating film: two-layer structure of Ni-plating layer and Sn-plating layer
Terminal blocks
Base material: oxygen-free copper
Plating layer: two-layer structure of Ni-plating layer and Sn-plating layer
Diameter: about 3 mm
Height: about 3 mm
Bonding material
Bonding material between each outer electrode and each metal terminal: Sn-10Sb solder
Bonding material between each metal terminal and each terminal block: Sn-10Sb solder
Packaging material: epoxy resin The specifications of the multilayer ceramic capacitor that is each of the multilayer ceramic electronic component bodies included in the multilayer ceramic electronic component according to Example 3 are as follows:
Dimensions l×w×t (design values) of each multilayer ceramic electronic component body: about 5.7 mm×about 5.0 mm×about 2.7 mm
Material of ceramic layers: BaTiO$_3$
Capacitance: about 153 nF
Rated voltage: about 1250 V
Material of internal electrode layers: Ni
Outer electrodes
Base electrode layers: base electrode layer containing Cu and glass
Thickness at ½ location along the longitudinal direction l on the side surface or main surface: about 45 μm
Thickness at ½ location along the height direction t on the end surface: about 83 μm
Plating layer: two-layer structure of Ni-plating layer and Sn-plating layer
Thickness of the Ni-plating layer at ½ location along the longitudinal direction l on the side surface or main surface: about 3 μm
Thickness of the Ni-plating layer at ½ location along the height direction t on the end surface: 3 about μm
Thickness of the Sn-plating layer at ½ location along the longitudinal direction l on the side surface or main surface: about 4 μm
Thickness of the Sn-plating layer at ½ location along the height direction t on the end surface: 4 μm On the other hand, a multilayer ceramic electronic component 1 with metal terminals was prepared as Comparative Example 1, and a film capacitor 4 was prepared as Comparative Example 2.

For samples of Comparative Example 1, the multilayer ceramic electronic component with metal terminals as shown in FIG. 24A was prepared. The multilayer ceramic electronic component 1 with metal terminals includes multilayer ceramic capacitors 2 that are two multilayer ceramic electronic component bodies, and a pair of metal terminals 3. The pair of metal terminals 3 includes a first metal terminal 3a and a second metal terminal 3b.

As shown in FIGS. 24A and 24B, in front view, the dimension of the multilayer ceramic electronic component 1 with metal terminals, including the first metal terminal 3a and the second metal terminal 3b, in the width direction is defined as L dimension, the dimension of the multilayer ceramic electronic component 1 with metal terminals in a front and rear direction is defined as Width dimension, and the dimension of the multilayer ceramic electronic component 1 with metal terminals, including the first metal terminal 3a and the second metal terminal 3b, in the height direction is defined as Thickness dimension.

The specifications of the multilayer ceramic electronic component with metal terminals, used as Comparative Example 1, are as follows:
Dimensions L×W×T (design values, metal terminals included) of each multilayer ceramic electronic component: about 6.0 mm×about 5.2 mm×about 6.0 mm
Capacitance: about 304 μF
Rated voltage: about 1250 V
Number of multilayer ceramic electronic component bodies: 2
Connection structure: parallel connection Metal terminals
  Base material: SUS430
  Average coefficient of linear expansion at −55 degrees C. to 200 degrees C. by measuring method of JIS Z 2285:2003: about $12 \times 10^{-6}$
  Plating film: two-layer structure of Ni-plating layer and Sn-plating layer
  Terminal blocks: None
  Bonding material
  Bonding material between each outer electrode and each metal terminal: Sn-10Sb solder The specifications of the multilayer ceramic capacitor that is each of the multilayer ceramic electronic component bodies included in the multilayer ceramic electronic component according to Comparative Example 1 are as follows:
  Dimensions l×w×t (design values) of each multilayer ceramic electronic component body: about 5.7 mm×about 5.0 mm×about 2.7 mm
  Material of ceramic layers: $BaTiO_3$
  Capacitance: about 152 nF
  Rated voltage: about 1250 V
  Material of internal electrode layers: Ni
  Outer electrodes
  Base electrode layers: base electrode layer containing Cu and glass
  Thickness at ½ location along the longitudinal direction l on the side surface or main surface: about 48 μm
  Thickness at ½ location along the height direction t on the end surface: about 88 μm
  Plating layer: two-layer structure of Ni-plating layer and Sn-plating layer
  Thickness of the Ni-plating layer at ½ location along the longitudinal direction 1 on the side surface or main surface: about 3 μm
  Thickness of the Ni-plating layer at ½ location along the height direction t on the end surface: about 3 μm
  Thickness of the Sn-plating layer at ½ location along the longitudinal direction l on the side surface or main surface: about 4 μm
  Thickness of the Sn-plating layer at ½ location along the height direction l on the end surface: about 4 μm The film capacitor as shown in FIG. 25A was prepared for samples of Comparative Example 2. The film capacitor 4 includes a rectangular parallelepiped capacitor body portion 5 and a pair of metal terminals 6. The pair of metal terminals 6 includes a first metal terminal 6a and a second metal terminal 6b.

As shown in FIGS. 25A and 25B, in front view, the dimension of the capacitor body portion 5 of the film capacitor 4 in the width direction is defined as L dimension, the dimension of the capacitor body portion 5 of the film capacitor 4 in the front and rear direction is defined as Width dimension, and the dimension of the capacitor body portion 5 of the film capacitor 4 in the height direction is defined as Thickness dimension.

The specifications of the film capacitor used as Comparative Example 2 are as follows:
  Dimensions L×W×T (design values: dimensions except the metal terminals) of the film capacitor: about 31.5 mm×about 11.0 mm×about 27.0 mm
  Film material: polypropylene
  Capacitance: about 330 nF
  Rated voltage: about 1000 V
  Material of internal electrodes: Al
  Packaging material: epoxy resin Method of Checking Heat Radiation Property After various samples were mounted on a substrate made of glass epoxy resin, heat generation resulting from passage of current was measured. In an environment at an ambient temperature of about 25 degrees C., AC current of about 300 kHz, about 120 Vp-p, and about 5 Arms was passed through the products, a temperature at zero minutes and a temperature after a lapse of 10 minutes were measured, and the difference between those temperatures was defined as a temperature rise.

A temperature was measured at ½ location of L dimension along the longitudinal direction Z and at ½ location of Width dimension along the width direction Y on the upper face of each sample.

For Comparative Example 2, to match the electrostatic capacitance with those of Examples, two capacitors were mounted in parallel, and were evaluated.

Method of Checking for Cracks

Various samples were respectively mounted on the glass epoxy resin substrates and then subjected to a heat cycle test.

The heat cycle test was performed in a vapor phase, and the cycle that the samples were held at about −55 degrees C. for about 30 minutes and also the cycle that the samples were held at about 150 degrees C. for about 30 minutes were repeated a selected number of times.

The samples after being subjected to the test the selected number of times were cross-sectioned and were checked for cracks in the multilayer ceramic electronic component bodies (multilayer ceramic capacitors).

The cross-sectioning was performed along LT cross section, and the first multilayer ceramic capacitor (closest to the first side surface 50c) was checked at ½ location of Width dimension.

Method of Measuring Electrostatic Capacitance

The electrostatic capacities of the capacitors of Example 1 to Example 3, Comparative Example 1, and Comparative Example 2 were measured with a capacitance meter (LCR meter) under the measurement conditions that conform to the standards (JIS C 5101-1:2010).

Method of Measuring Dimensions of Each Sample

The dimensions of each of the electronic components of Example 1 to Example 3, Comparative Example 1, and Comparative Example 2 were measured with a micrometer.

How to Measure Coefficient of Linear Expansion of Base Material of Metal Terminal The average coefficients of linear expansion at about −55 degrees C. to about 200 degrees C. were measured in accordance with JIS Z 2285:2003.

Method of Measuring Mounting Area

The length of the outline of each sample when viewed in a direction perpendicular to the mounting substrate plane was measured with a micrometer, and then the mounting area was calculated from the measured value.

Method of Measuring Mounting Volume

The length of the outline of each sample when viewed in a direction perpendicular to the mounting substrate plane and the height were measured with a micrometer, and the mounting volume was calculated from the measured values.

The results of the above-described heat generation measurement on Example 1 to Example 3, and Comparative Example 1 are shown in Table 1, and the results of a heat cycle test are shown in Table 2.

In addition, the measured results of the dimensions, mounting volume, and mounting area of each of the samples of Example 1 to Example 3, Comparative Example 1, and Comparative Example 2 are shown in Table 3.

TABLE 1

| | EXAMPLE 1 | EXAMPLE 2 | EXAMPLE 3 | COMPARATIVE EXAMPLE 1 |
|---|---|---|---|---|
| HEAT GENERATION TEMPERATURE (° C.) | 8.9 | 9.0 | 8.5 | 12.3 |

TABLE 2

| | NUMBER OF CRACKED SAMPLES (NUMBER/NUMBER) | | | |
|---|---|---|---|---|
| NUMBER OF CYCLES | EXAMPLE 1 | EXAMPLE 2 | EXAMPLE 3 | COMPARATIVE EXAMPLE 1 |
| 0 | 0/10 | 0/10 | 0/10 | 0/10 |
| 500 | 0/10 | 0/10 | 0/10 | 0/10 |
| 1000 | 0/10 | 0/10 | 1/10 | 0/10 |
| 1500 | 0/10 | 0/10 | 3/10 | 0/10 |
| 2000 | 0/10 | 0/10 | 5/10 | 0/10 |

TABLE 3

| | DIMENSIONS (INCLUDING TERMINAL BLOCKS) | | | | |
|---|---|---|---|---|---|
| | L DIMENSION (mm) | WIDTH DIMENSION (mm) | THICKNESS DIMENSION (mm) | MOUNTING VOLUME (mm$^3$) | MOUNTING AREA (mm$^2$) |
| EXAMPLE 1 | 14.0 | 14.0 | 8.0 | 1568.0 | 196.0 |
| EXAMPLE 2 | 14.0 | 14.0 | 8.0 | 1568.0 | 196.0 |
| EXAMPLE 3 | 14.0 | 14.0 | 8.0 | 1568.0 | 196.0 |
| COMPARATIVE EXAMPLE 1 | 6.0 | 5.2 | 6.0 | 187.2 | 31.2 |
| COMPARATIVE EXAMPLE 2 | 31.5 | 11.0 | 27.0 | 9355.5 | 346.5 |

The heat generation measurement results shown in Table 1 show that, since the multilayer ceramic electronic components that are the samples of Example 1 to Example 3 had the terminal blocks 40, the temperature rises were respectively about 8.9 degrees C., about 9.0 degrees C., and about 8.5 degrees C. and were relatively low.

On the other hand, the multilayer ceramic electronic component that is the sample of Comparative Example 1 exhibited a temperature rise of about 12.3 degrees C. greater than the temperature rises of Examples.

Next, the numbers of found cracks through a heat cycle test in Table 2 show that, for the multilayer ceramic electronic components that are the samples of Example 1 and Example 2, the samples were subjected to a heat cycle test over 0 cycles, 500 cycles, 1000 cycles, 1500 cycles, and 2000 cycles and then no crack was found in the multilayer ceramic electronic component bodies.

For the multilayer ceramic electronic components that are the samples of Example 3, the samples were subjected to a heat cycle test over 0 cycles and 500 cycles and then no crack was found in the multilayer ceramic electronic component bodies. However, over 1000 cycles, 1500 cycles, and 2000 cycles in a heat cycle test, the numbers of found cracks were respectively 1 out of 10, 3 out of 10, and 5 out of 10.

On the other hand, for the multilayer ceramic electronic components that are the samples of Comparative Example 1, no crack was found in the multilayer ceramic electronic component bodies over 0 cycles, 500 cycles, 1000 cycles, 1500 cycles, and 2000 cycles in a heat cycle test.

Subsequently, the mounting volume and the mounting area in Table 3 show that, for the multilayer ceramic electronic components that are the samples of Example 1 to Example 3, the mounting volume was about 1568.0 mm$^3$ and the mounting area was about 196.0 mm$^2$.

On the other hand, for the film capacitors that are the samples of Comparative Example 2, the mounting volume was 9355.5 mm$^3$, and the mounting area was 346.5 mm$^2$. The electrostatic capacitance of each of the multilayer ceramic electronic components that are the samples of Example 1 to Example 3 is about 612 µF. The electrostatic capacitance of each of the film capacitors that are the samples of Comparative Example 2 is about 330 µF per one capacitor. Therefore, the electrostatic capacitance of each of the film capacitors that are the samples of Comparative Example 2 is about half of the electrostatic capacitance of each of the multilayer ceramic electronic components that are the samples of Example 1 to Example 3. When compared under the equivalent electrostatic capacitance on the assumption of an actual use, each of the film capacitors that are the samples of Comparative Example 2 requires twice the mounting volume and the mounting area shown in Table 3.

From the above results, in the multilayer ceramic electronic components according to Example 1 to Example 3, since the terminal blocks 40 are connected to the metal terminals 30 to which the multilayer ceramic electronic component bodies 12 are connected, so miniaturization is possible, and low-thermal-resistance connection between each multilayer ceramic electronic component body 12 and a mounting board is achieved. As a result, the heat radiation property of the multilayer ceramic electronic component is improved.

In addition, it was suggested that, as in the case of the multilayer ceramic electronic components according to Example 1 and Example 2, when the metal terminals 30 were made of a metal having a coefficient of linear expansion of less than or equal to about $12 \times 10^{-6}$, thermal stress that develops as a result of the difference in coefficient of linear expansion between each multilayer ceramic electronic component body 12 and each metal terminal 30 was reduced and cracks caused by the heat cycle of each multilayer ceramic electronic component were also reduced. Thus, it was found that not only improvement in the heat radiation property of the multilayer ceramic electronic component but also crack reduction of the multilayer ceramic electronic component bodies 12 was achieved.

Furthermore, in each of the multilayer ceramic electronic components according to Example 1 to Example 3, the thickness dimension of each multilayer ceramic electronic component body 12 in the height direction x connecting the first main surface 14a and the second main surface 14b is less than the width dimension of each multilayer ceramic electronic component body 12 in the width direction y connecting the first side surface 14c and the second side surface 14d, and each multilayer ceramic electronic component body 12 is disposed such that the first side surface 14c or the second side surface 14d faces a mounting surface. That is, each multilayer ceramic electronic component body 12 is disposed such that facing planes of the internal electrode layers 18 and the mounting surface are perpendicular to each other, and is disposed such that the first side surface 14c or second side surface 14d having a small area faces the mounting surface. In this way, when the face having a small area is disposed on a mounting surface, the mounting volume and the mounting area can be reduced as compared to the film capacitor according to Comparative Example 2.

The preferred embodiments of the present invention are described above. However, the present invention is not limited to the preferred embodiments.

That is, various modifications in mechanism, shape, material, number, amount, location, disposition, or the like, may be added to the above-described preferred embodiments without departing from the technical idea and object of the present invention. The present invention also encompasses those modifications.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer ceramic electronic component, comprising:
   a plurality of multilayer ceramic electronic component bodies each including:
      a laminate including laminated ceramic layers, the laminate including a first main surface and a second main surface on opposite sides in a height direction, a first side surface and a second side surface on opposite sides in a width direction perpendicular or substantially perpendicular to the height direction, and a first end surface and a second end surface on opposite sides in a longitudinal direction perpendicular or substantially perpendicular to the height direction and the width direction;
      a first outer electrode disposed on the first end surface and extended to at least a portion of the first side surface and at least a portion of the second side surface; and
      a second outer electrode disposed on the second end surface and extended to at least a portion of the first side surface and at least a portion of the second side surface;
   a first metal terminal connected to each first outer electrode;
   a second metal terminal connected to each second outer electrode;
   a first terminal block connected to the first metal terminal; and
   a second terminal block connected to the second metal terminal; wherein
   the first and second terminal blocks are respectively bonded to a lower surface of the first and second metal terminals;
   a thickness dimension of each of the plurality of multilayer ceramic electronic component bodies in the height direction connecting the first main surface and the second main surface is less than a width dimension of each of the plurality of multilayer ceramic electronic component bodies in the width direction connecting the first side surface and the second side surface;
   each of the plurality of multilayer ceramic electronic component bodies is disposed such that the first side surface or the second side surface faces a mounting surface;
   the first metal terminal is disposed astride the first outer electrodes of the plurality of multilayer ceramic electronic component bodies; and
   the second metal terminal is disposed astride the second outer electrodes of the plurality of multilayer ceramic electronic component bodies.

2. The multilayer ceramic electronic component according to claim 1, wherein the first metal terminal and the second metal terminal are made of a metal having a coefficient of linear expansion of about $12 \times 10^{-6}$ or below.

3. The multilayer ceramic electronic component according to claim 1, wherein
   the first terminal block and the second terminal block each include a base material and a plating film disposed on a surface of the base material; and
   the base material is made of oxygen-free copper or a copper-based alloy, having a high thermal conductivity.

4. The multilayer ceramic electronic component according to claim 1, wherein a metal of each of the first metal terminal and the second metal terminal is selected from at least one of a stainless alloy, a titanium alloy, and a nickel alloy.

5. The multilayer ceramic electronic component according to claim 1, further comprising a packaging material that covers the laminate, the first outer electrode, and the second outer electrode of each of the plurality of multilayer ceramic electronic component bodies, the first metal terminal, the second metal terminal, at least a portion of the first terminal block, and at least a portion of the second terminal block.

6. The multilayer ceramic electronic component according to claim 5, wherein the packaging material is made of a silicone resin or an epoxy resin.

7. The multilayer ceramic electronic component according to claim 1, wherein
   the first metal terminal includes a first terminal bonding portion and a first extended portion;
   the first terminal bonding portion faces the first side surfaces or the second side surfaces, and is connected to the first outer electrodes;
   the first extended portion extends from the first terminal bonding portion and extends in a direction parallel or substantially parallel to the first side surfaces or the second side surfaces away from the plurality of multilayer ceramic electronic component bodies;

the second metal terminal includes a second terminal bonding portion and a second extended portion;

the second terminal bonding portion faces the first side surfaces or the second side surfaces, and is connected to the second outer electrodes; and the second extended portion extends from the second terminal bonding portion and extends in a direction parallel or substantially parallel to the first side surfaces or the second side surfaces away from the plurality of multilayer ceramic electronic component bodies.

8. The multilayer ceramic electronic component according to claim 7, wherein the first terminal block is disposed astride the first terminal bonding portion and the first extended portion of the first metal terminal; and the second terminal block is disposed astride the second terminal bonding portion and the second extended portion of the second metal terminal.

9. The multilayer ceramic electronic component according to claim 7, wherein the first terminal bonding portion is continuously connected to each of the first outer electrodes and overlaps gaps provided between the plurality of multilayer ceramic electronic component bodies; and the second terminal bonding portion is continuously connected to each of the second outer electrodes and overlaps the gaps provided between the plurality of multilayer ceramic electronic component bodies.

10. The multilayer ceramic electronic component according to claim 7, wherein the first terminal bonding portion includes first cutout portions provided between the plurality of multilayer ceramic electronic component bodies; and the second terminal bonding portion includes second cutout portions provided between the plurality of multilayer ceramic electronic component bodies.

11. The multilayer ceramic electronic component according to claim 1, wherein a plurality of the first terminal blocks are provided; and a plurality of the second terminal blocks are provided.

12. The multilayer ceramic electronic component according to claim 11, wherein the plurality of the first terminal blocks are disposed in a substantially staggered arrangement on the first metal terminal; and the plurality of the second terminal blocks are disposed in a substantially staggered arrangement on the second metal terminal.

13. The multilayer ceramic electronic component according to claim 1, wherein each of the first outer electrode and the second outer electrode of each of the plurality of multilayer ceramic electronic component bodies includes a base electrode layer and a plating layer.

14. The multilayer ceramic electronic component according to claim 1, wherein the plurality of multilayer ceramic electronic component bodies are arranged in parallel or substantially in parallel with one another.

15. The multilayer ceramic electronic component according to claim 1, wherein the first terminal block and the second terminal block have circular or substantially circular cylindrical shapes.

16. The multilayer ceramic electronic component according to claim 1, wherein the first terminal block includes a first base portion and a first extended portion, the first base portion having a total thickness that is greater than a total thickness of the first extended portion; and the second terminal block includes a second base portion and a second extended portion, the second base portion having a total thickness that is greater than a total thickness of the second extended portion.

* * * * *